US012665015B2

(12) United States Patent
Inaba et al.

(10) Patent No.: US 12,665,015 B2
(45) Date of Patent: Jun. 23, 2026

(54) MEMORY DEVICE

(71) Applicant: Kioxia Corporation, Tokyo (JP)

(72) Inventors: Tsuneo Inaba, Kamakura Kanagawa (JP); Takayuki Miyazaki, Tokyo (JP); Shinji Miyano, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 121 days.

(21) Appl. No.: 18/819,770

(22) Filed: Aug. 29, 2024

(65) Prior Publication Data

US 2025/0104759 A1     Mar. 27, 2025

(30) Foreign Application Priority Data

Sep. 21, 2023     (JP) ................................. 2023-155503

(51) Int. Cl.
*G11C 11/4074*       (2006.01)
*G11C 11/4091*       (2006.01)
*G11C 11/4094*       (2006.01)
*G11C 11/4099*       (2006.01)

(52) U.S. Cl.
CPC ...... *G11C 11/4074* (2013.01); *G11C 11/4091* (2013.01); *G11C 11/4094* (2013.01); *G11C 11/4099* (2013.01)

(58) Field of Classification Search
CPC .................................................. G11C 11/4074
See application file for complete search history.

(56) References Cited

U.S. PATENT DOCUMENTS

| | | | |
|---|---|---|---|
| 5,910,911 A * | 6/1999 | Sekiguchi | ............... G11C 11/22 |
| | | | 365/150 |
| 6,088,286 A * | 7/2000 | Yamauchi | ........... G11C 11/4074 |
| | | | 365/230.06 |
| 10,573,374 B2 | 2/2020 | Ishizu et al. | |
| 2006/0158924 A1 | 7/2006 | Sekiguchi | |
| 2017/0271341 A1 | 9/2017 | Tanaka et al. | |
| 2022/0108985 A1 | 4/2022 | Nagatsuka et al. | |

FOREIGN PATENT DOCUMENTS

| | | |
|---|---|---|
| JP | 2017-168622 A | 9/2017 |
| JP | 2018-073453 A | 5/2018 |
| WO | WO-2020/157558 A1 | 8/2020 |

OTHER PUBLICATIONS

D. Takashima et al., "Word-Line Architecture for Highly Reliable 64-Mb DRAM", IEEE Journal of Solid-State Circuits. vol. 27, No. 4, pp. 603-609, Apr. 1992.

* cited by examiner

*Primary Examiner* — Hoai V Ho
(74) *Attorney, Agent, or Firm* — Foley & Lardner LLP

(57)                    ABSTRACT

A memory device includes a transistor, a capacitor, a plate line, and a bit line. The transistor includes an oxide semiconductor and includes a first end, a second end, and a gate. The capacitor includes a third end and a fourth end. The fourth end is coupled to the second end. The plate line is coupled to the third end. The bit line is coupled to the first end. A second voltage lower than a first voltage is applied to the plate line during a first period over which the first voltage is applied to the gate. A fourth voltage higher than the second voltage is applied to the plate line during at least a part of a second period over which a third voltage lower than the first voltage is applied to the gate.

21 Claims, 19 Drawing Sheets

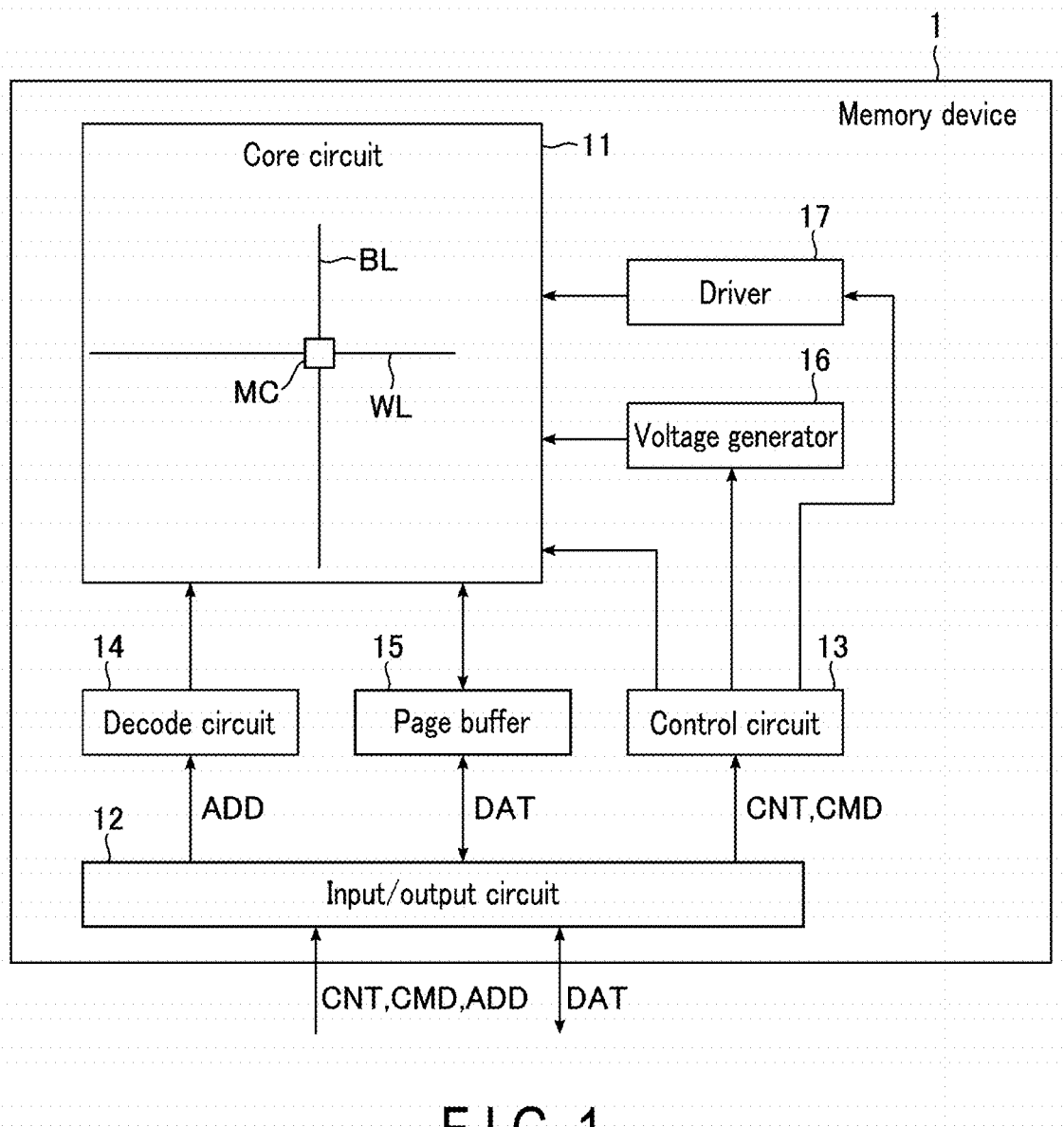
F I G. 1

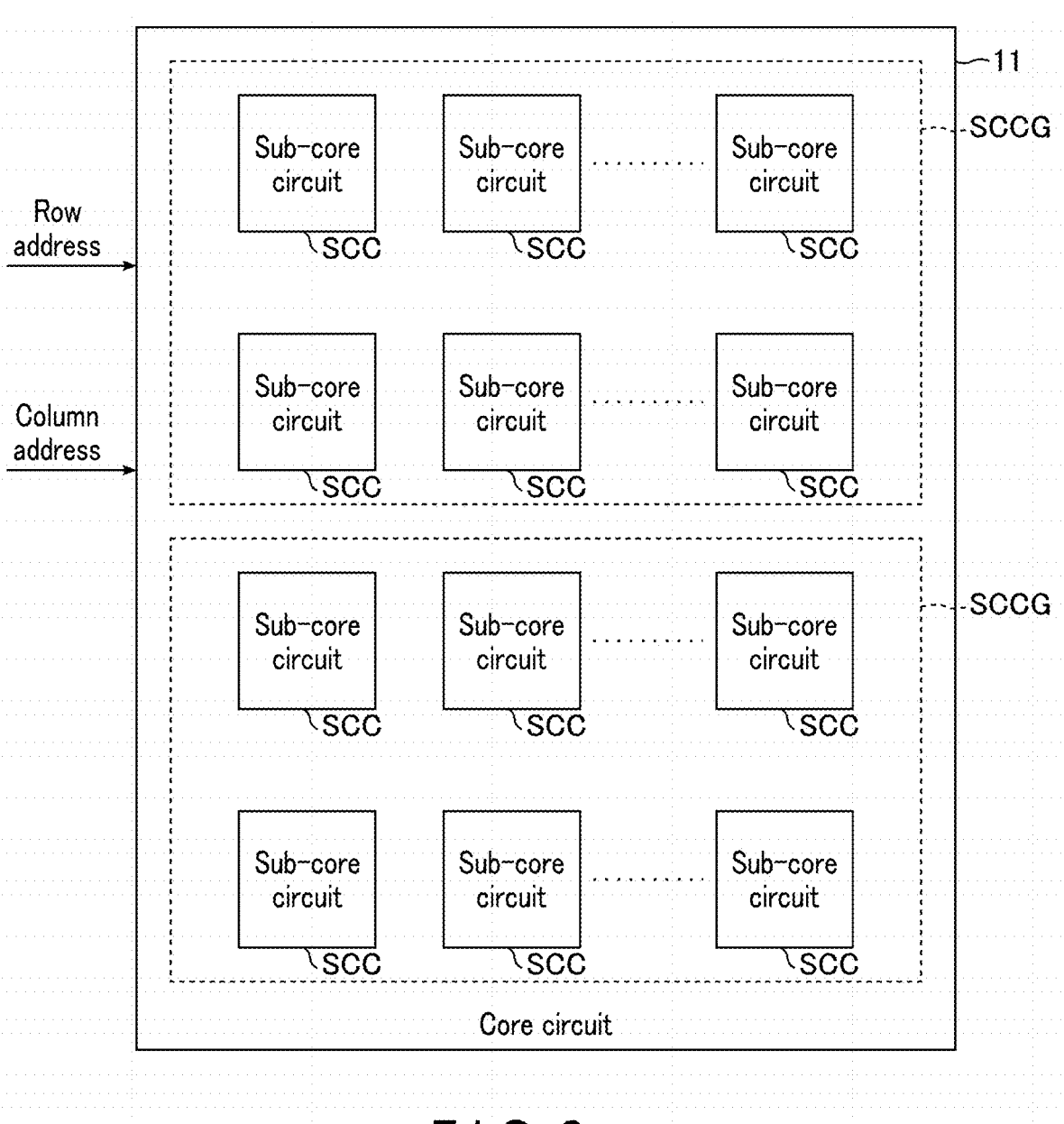
F I G. 2

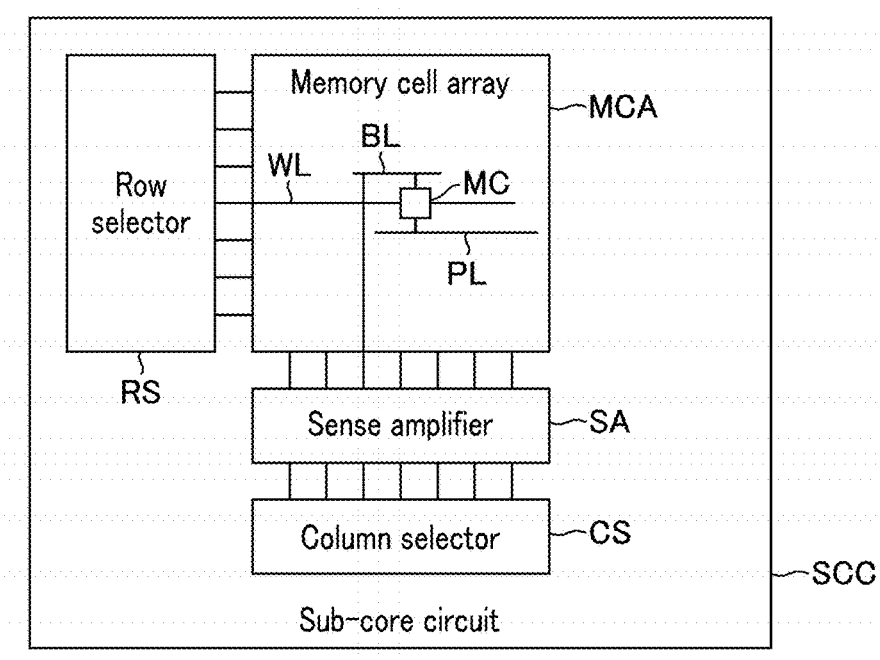
F I G. 3
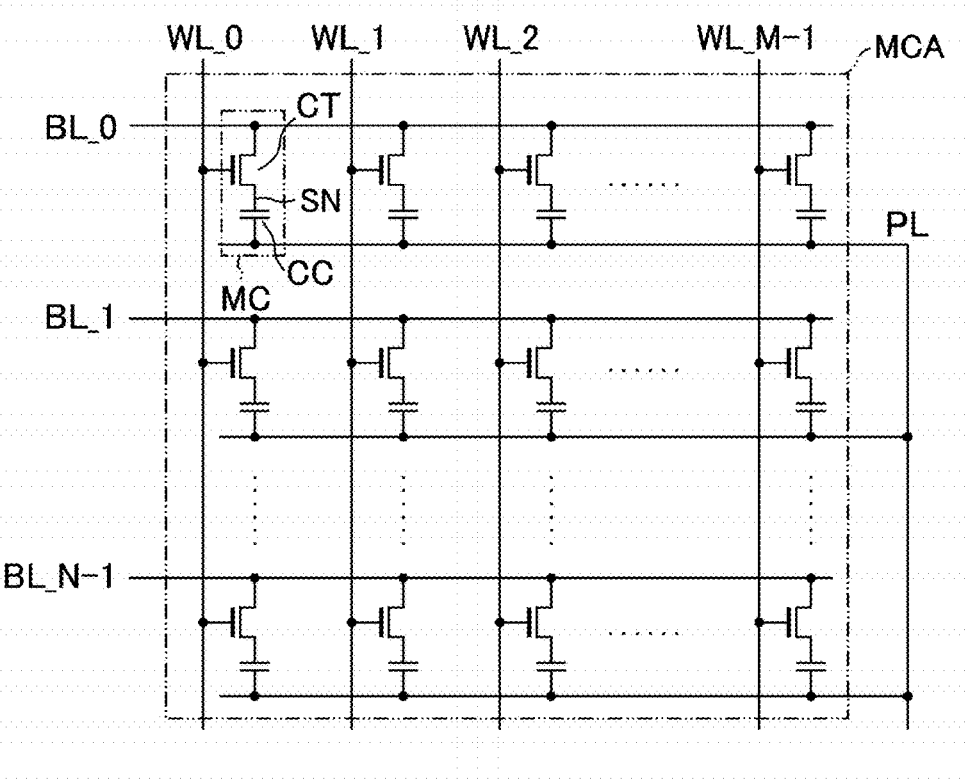
F I G. 4

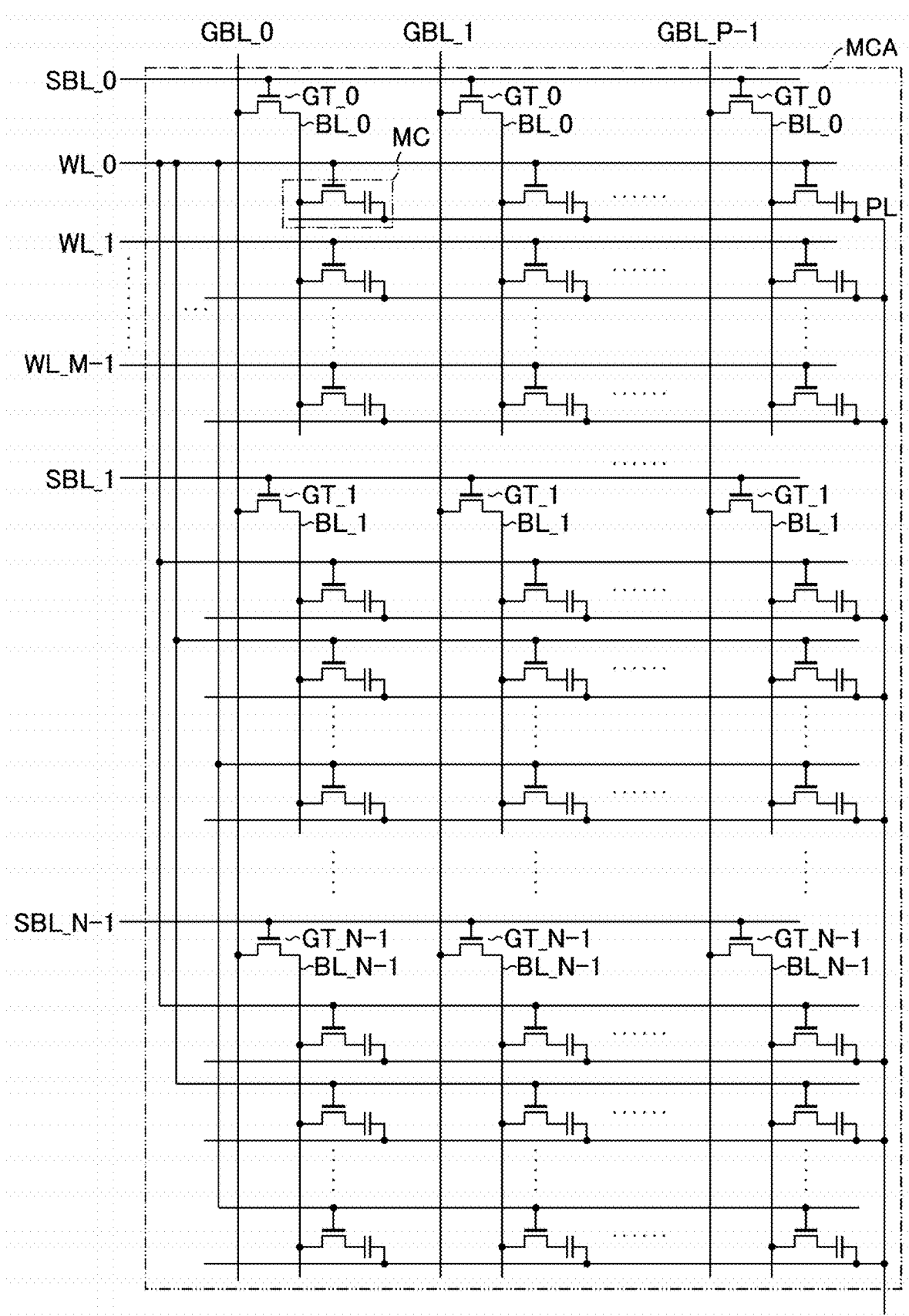
F I G. 5

29(GBL)
29(GBL)
29(GBL)
GT
GT
GT
SW2
MC
MC MCS
MC 22(PL)
28(SBL)
21(WL)
SW1
26
MC
MC
MC
MC
23(BL)
MC
23(BL)
MC
23(BL)
25
24(PL)
20
20
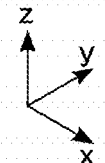
z
y
x
F I G. 6

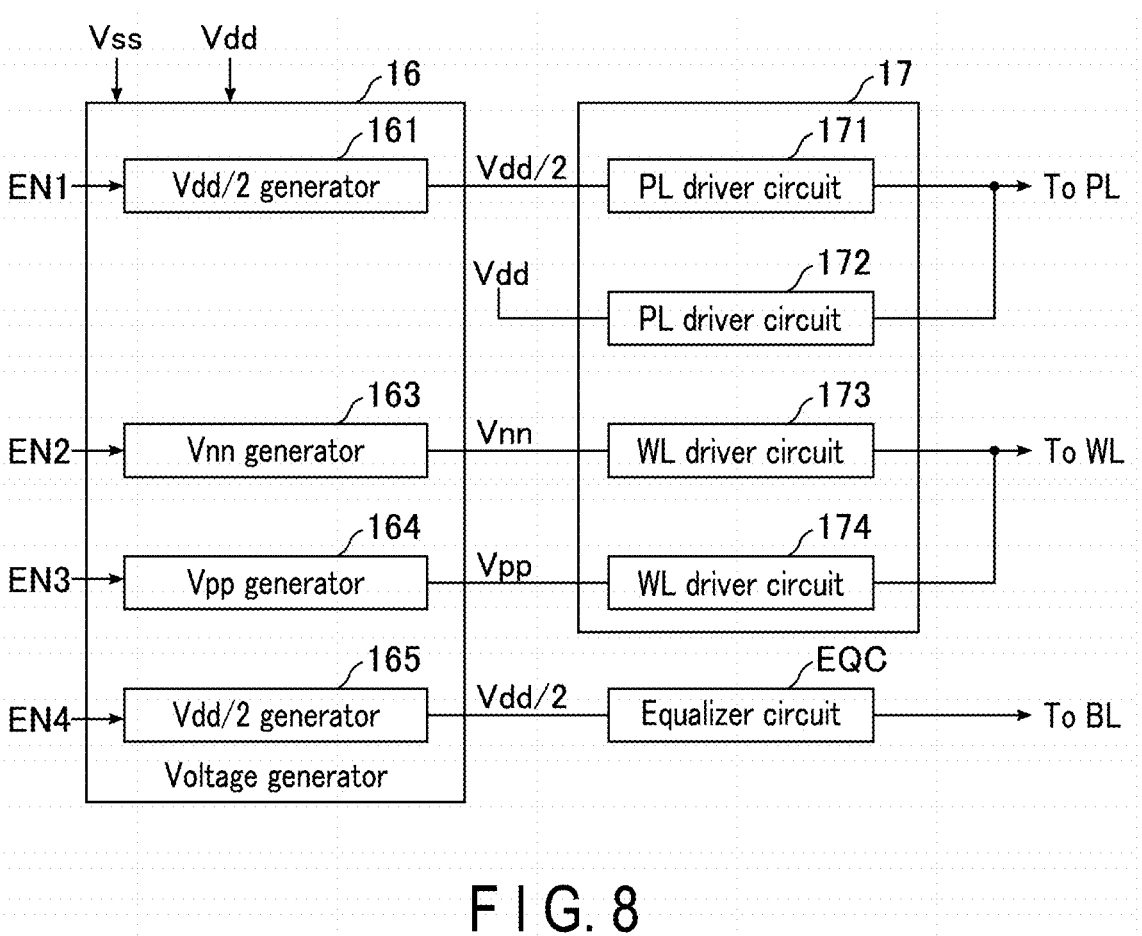
F I G. 8

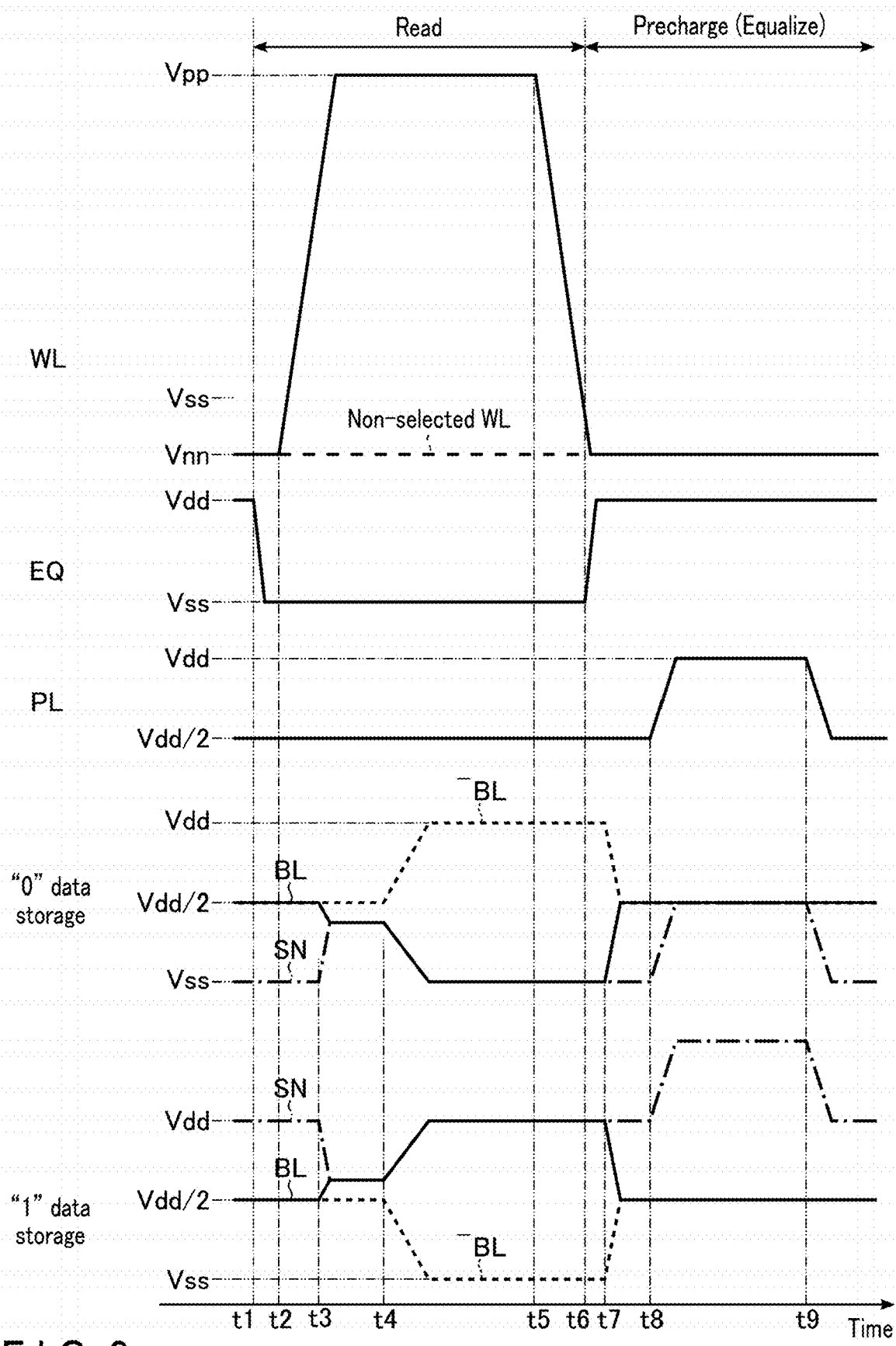
F I G. 9

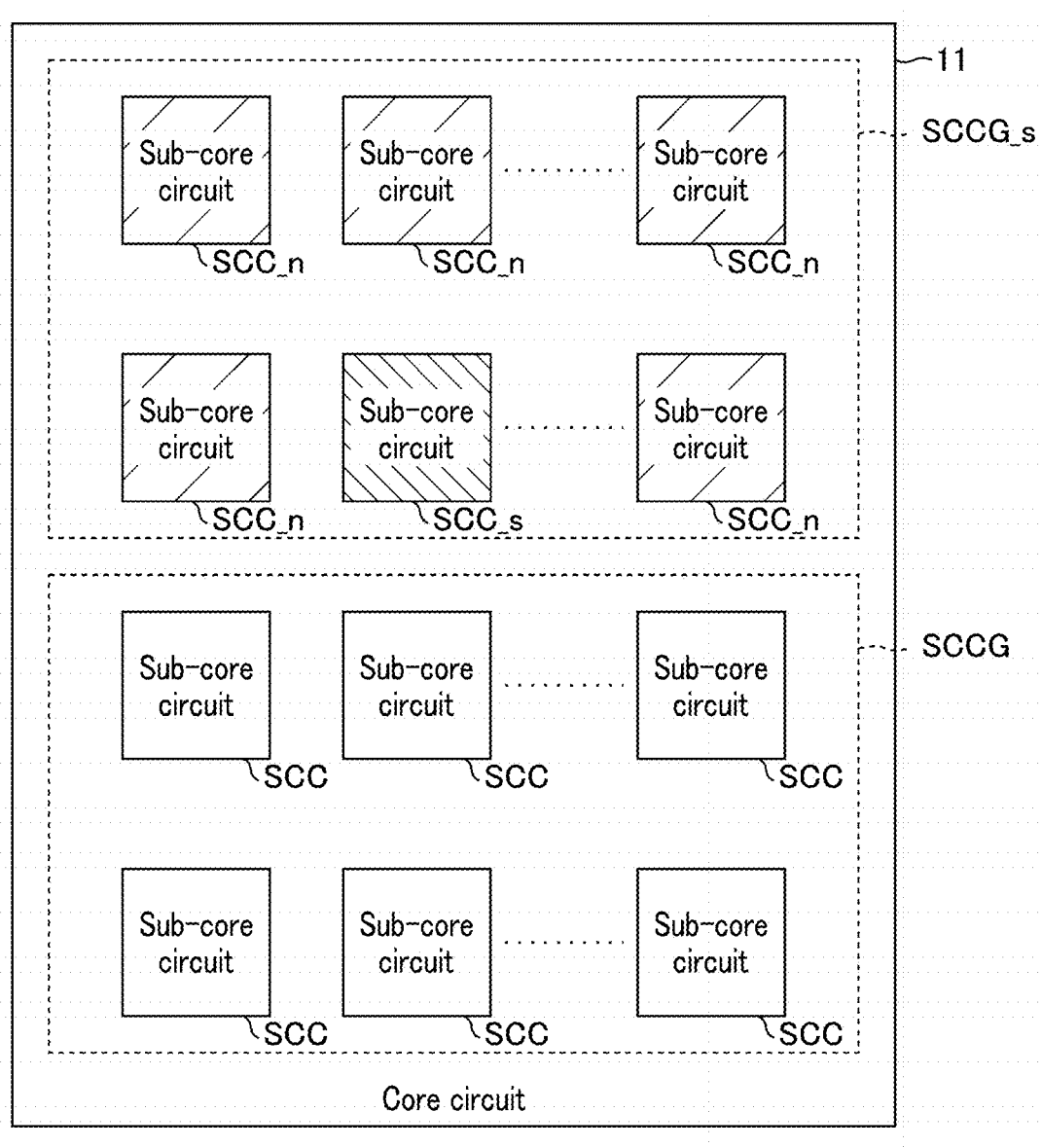
F I G. 10

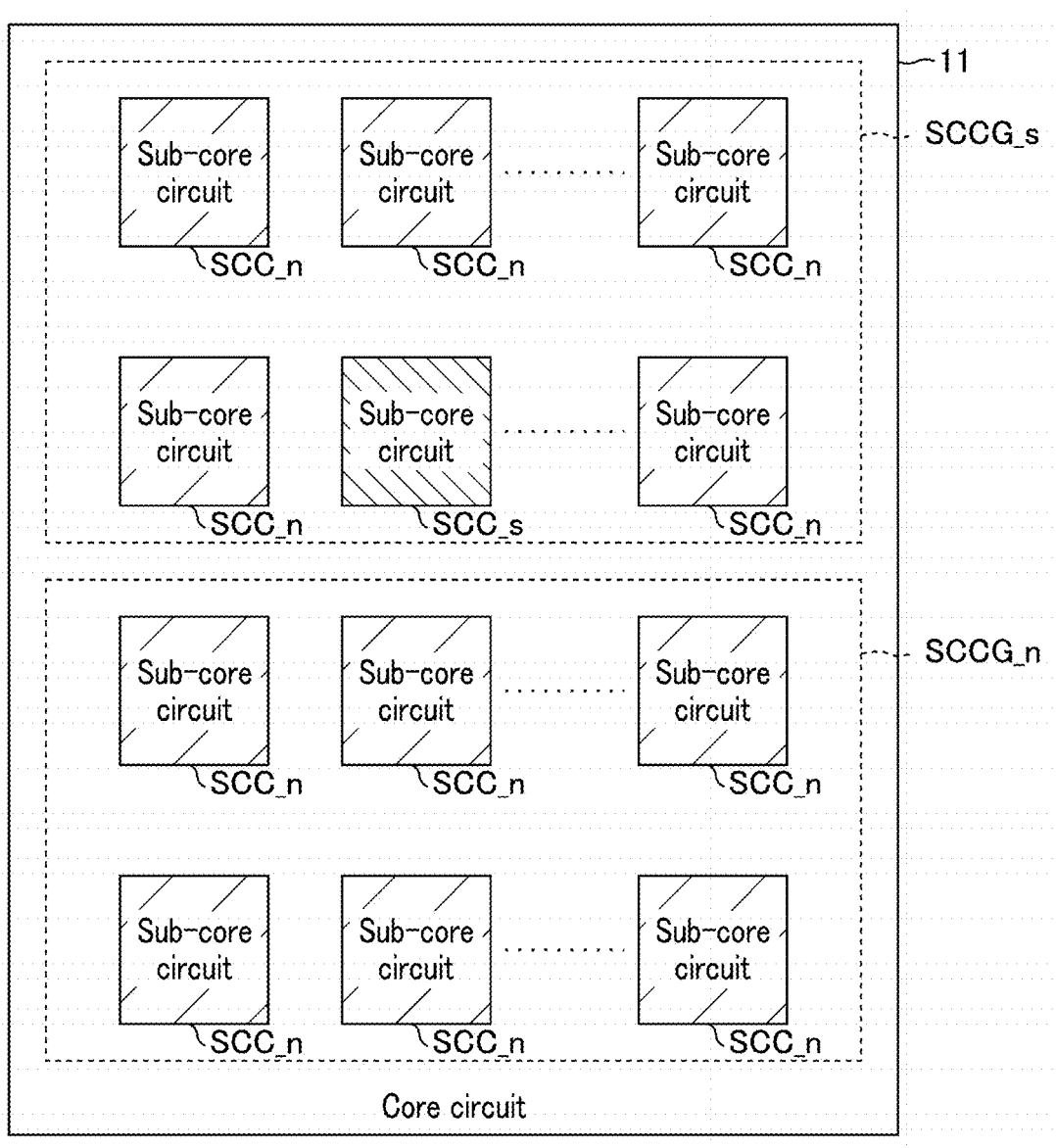
F I G. 11

F I G. 12
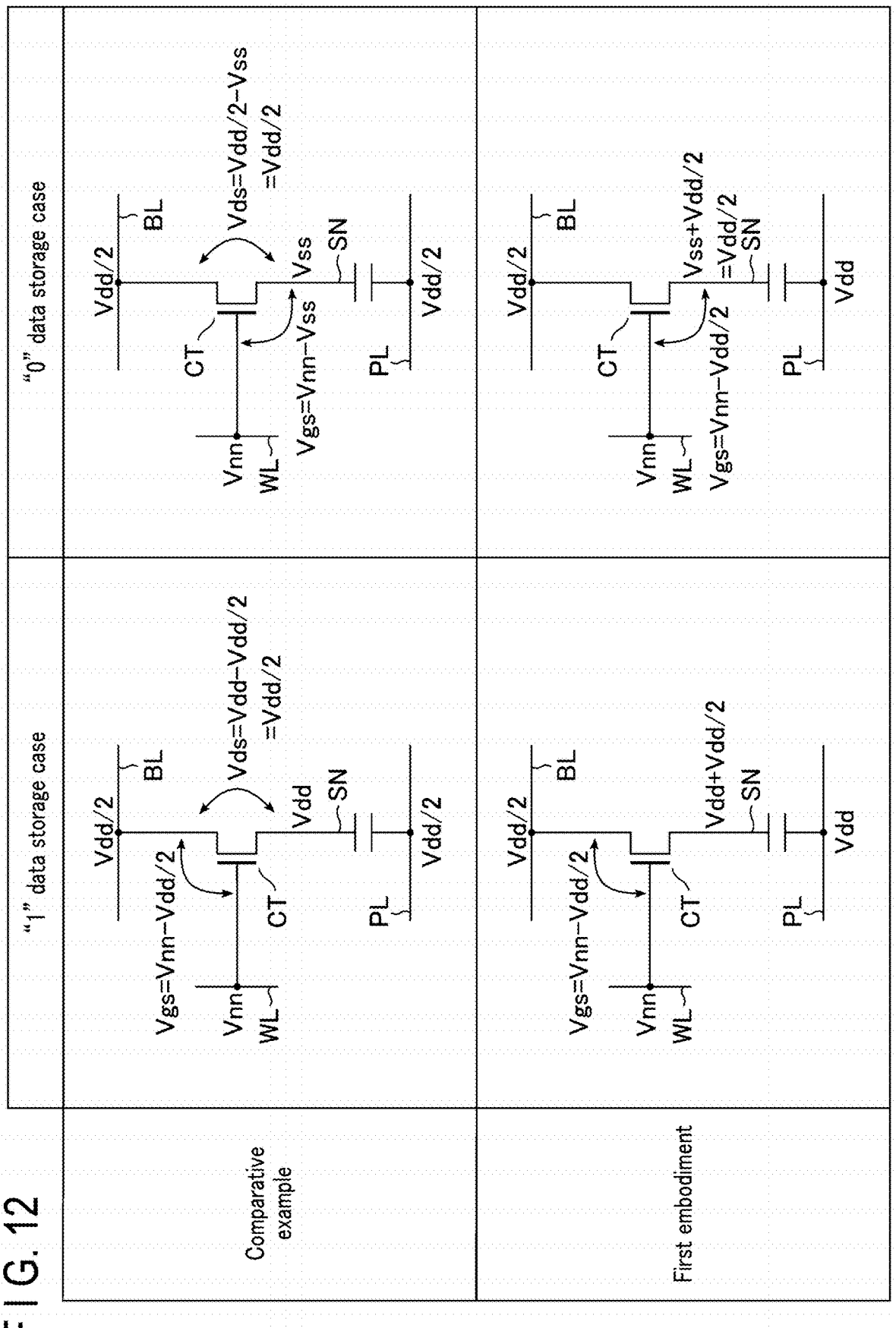

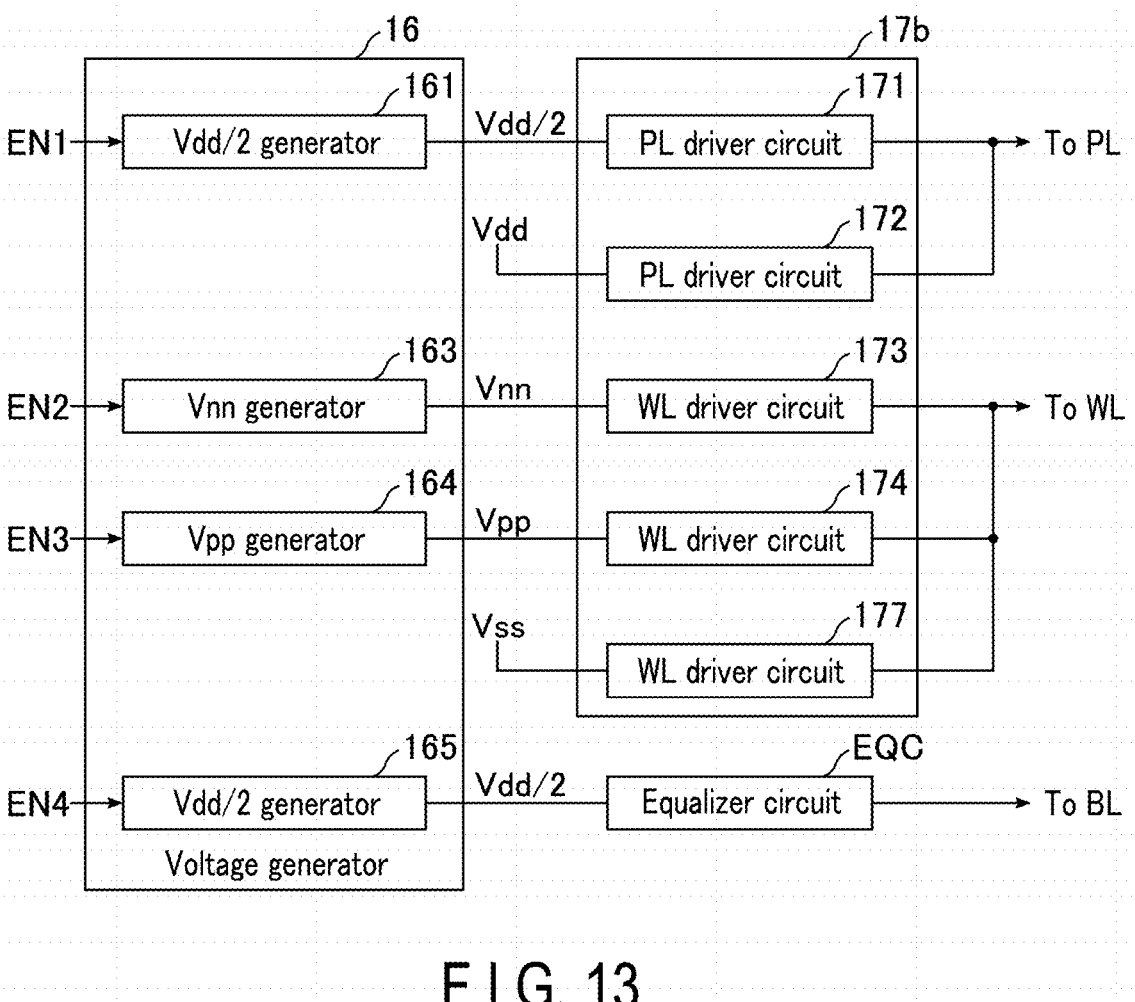
F I G. 13

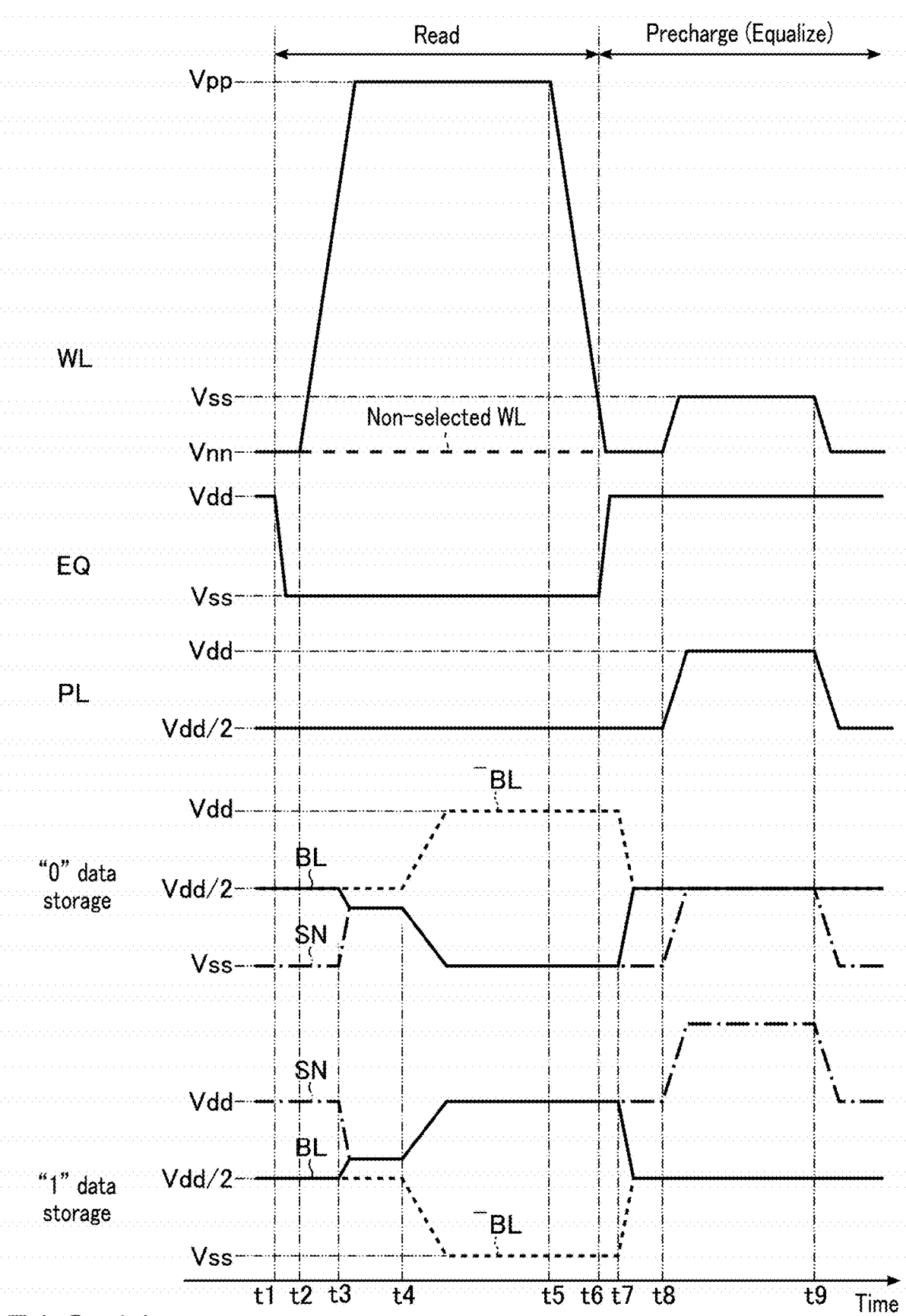
F I G. 14

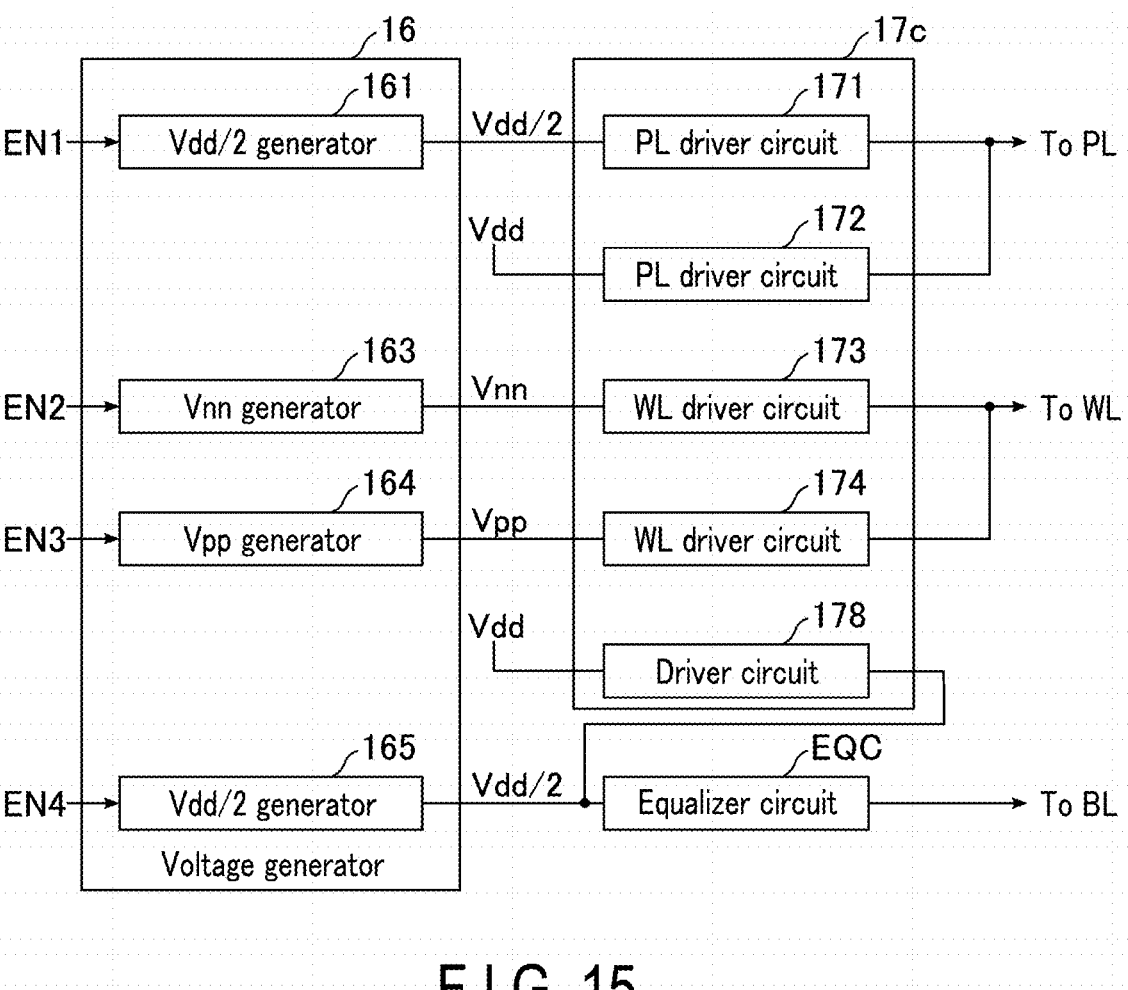
F I G. 15

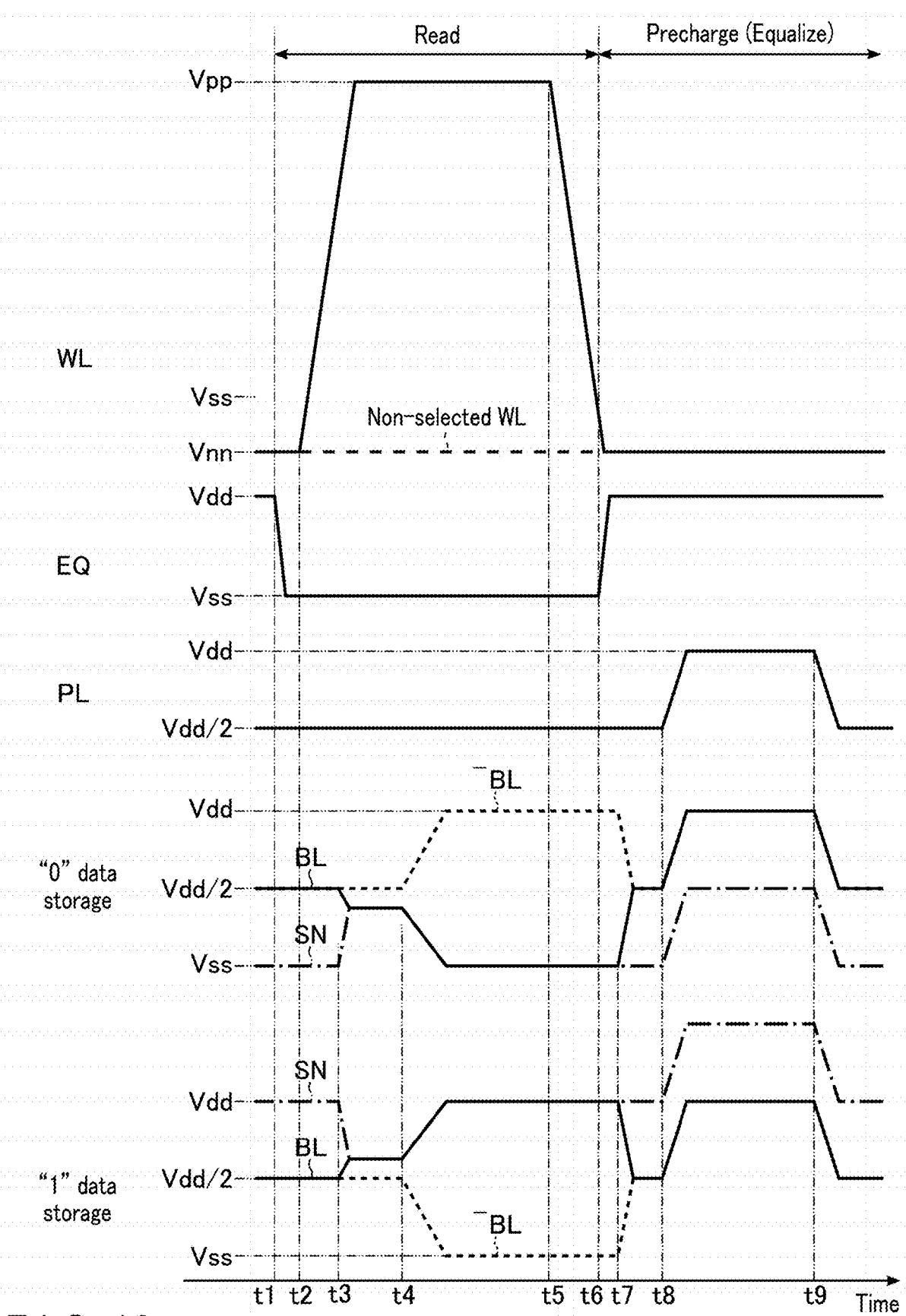
F I G. 16

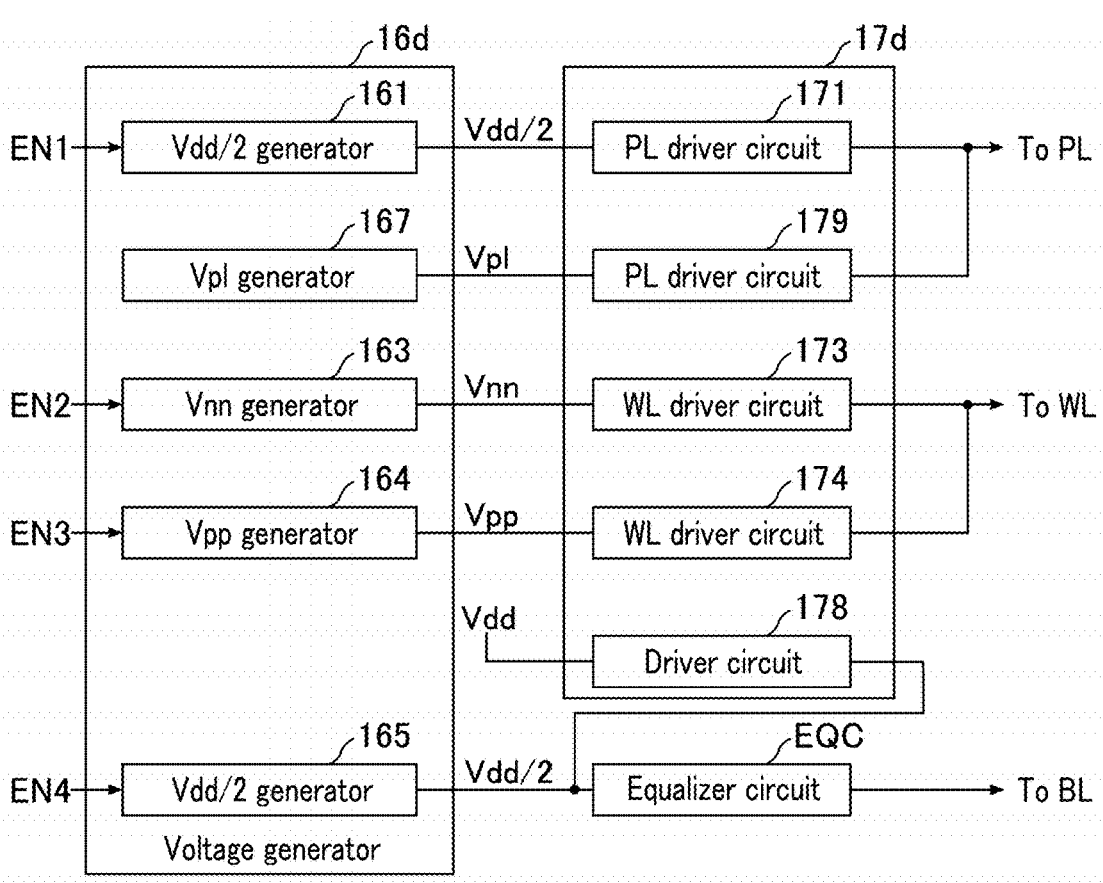
F I G. 17
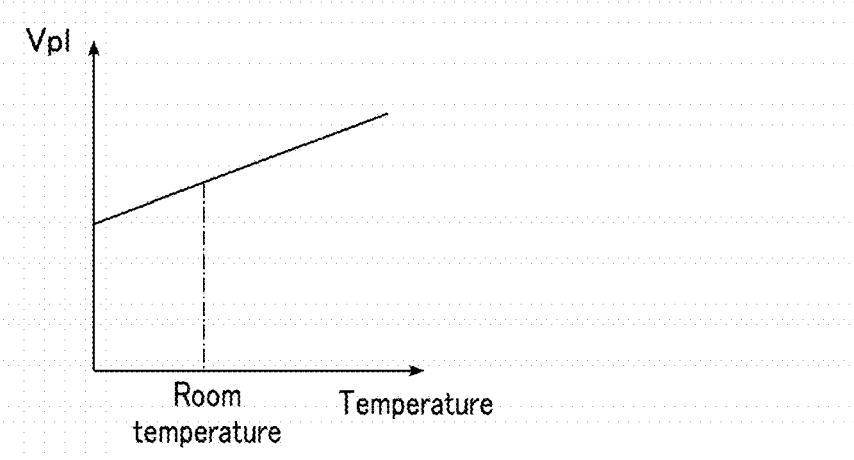
F I G. 18

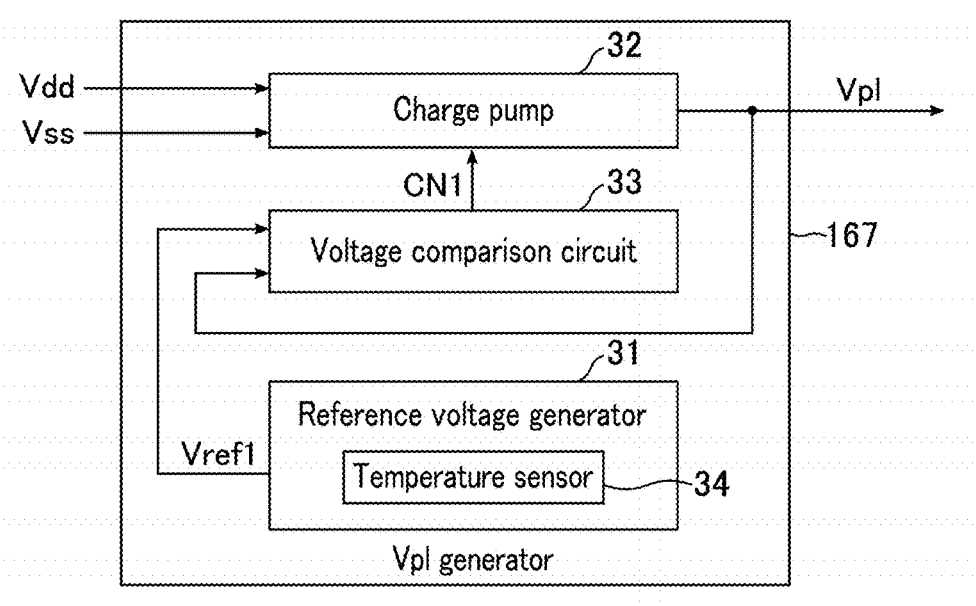
F I G. 19
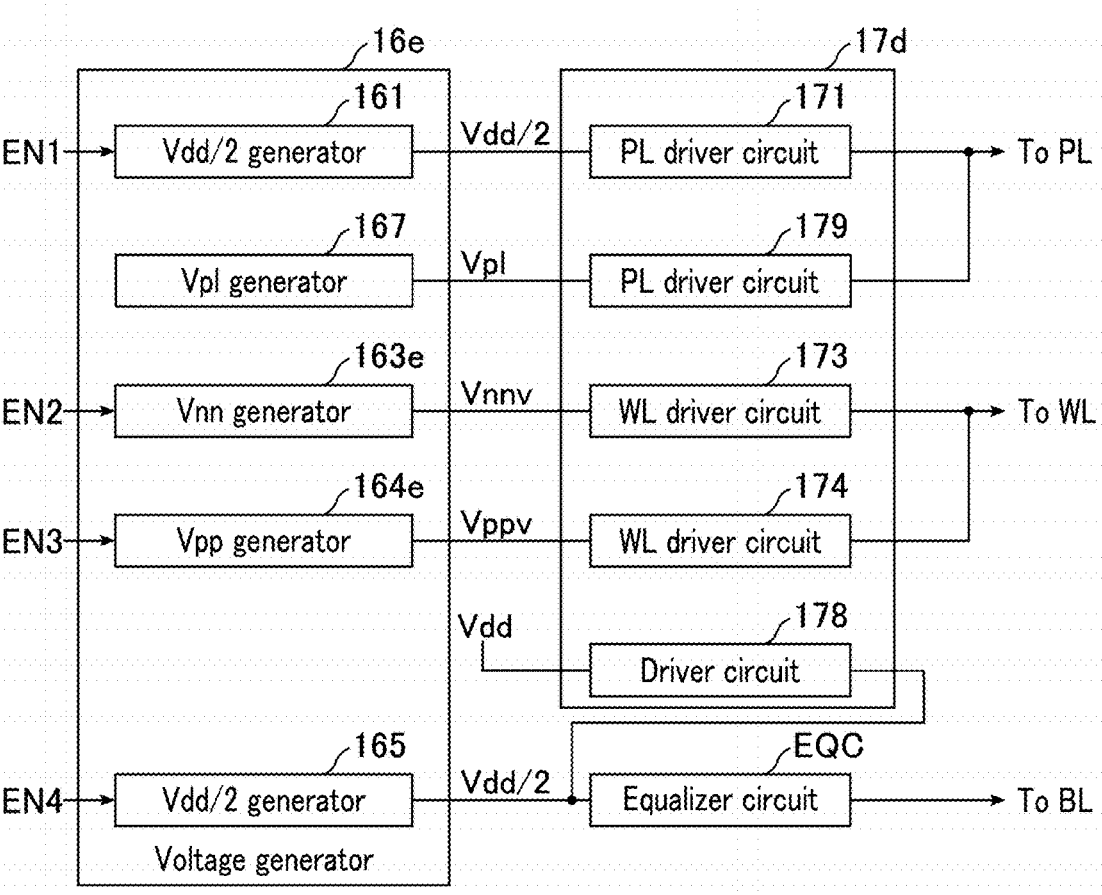
F I G. 20

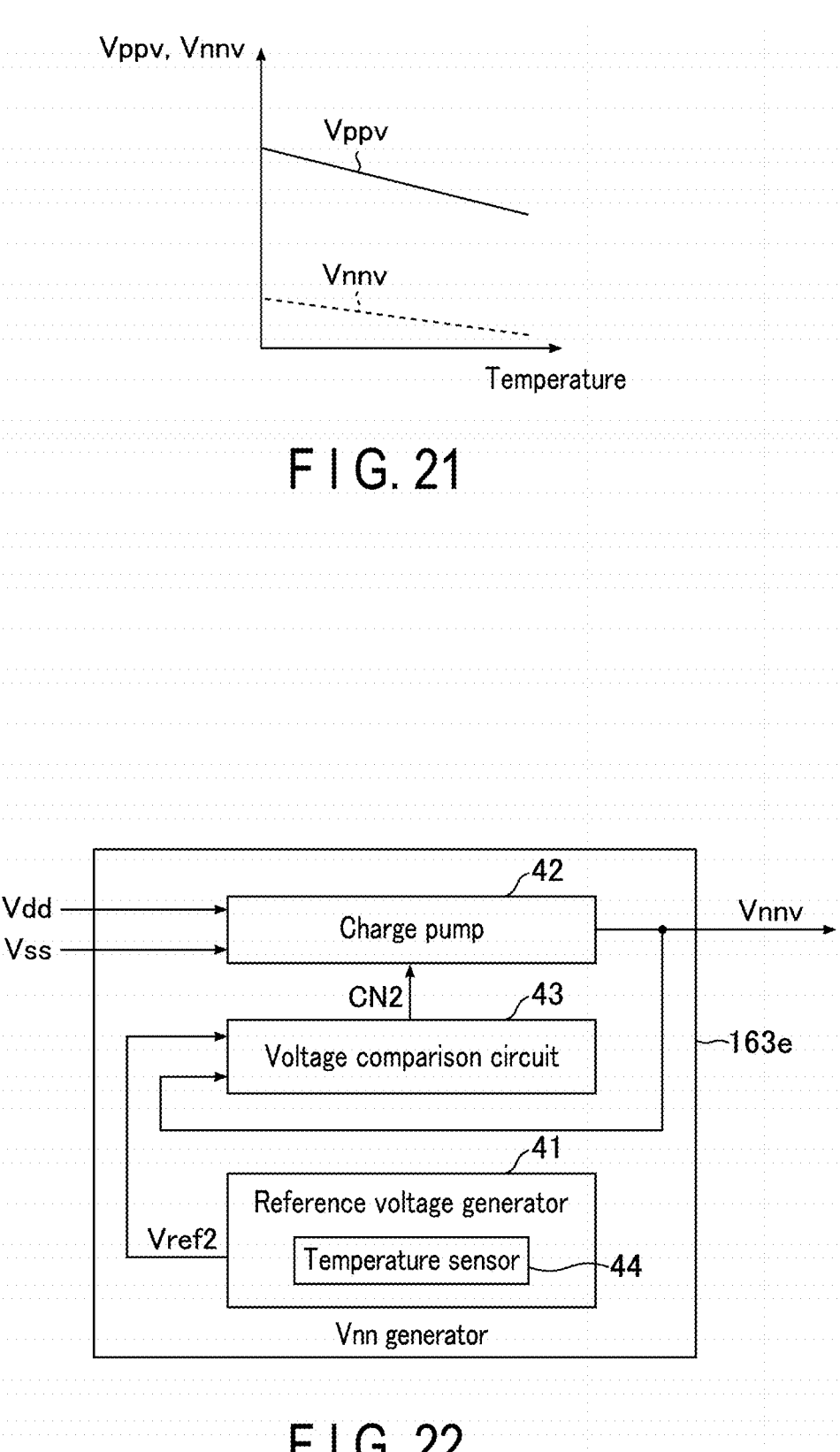
F I G. 21
F I G. 22

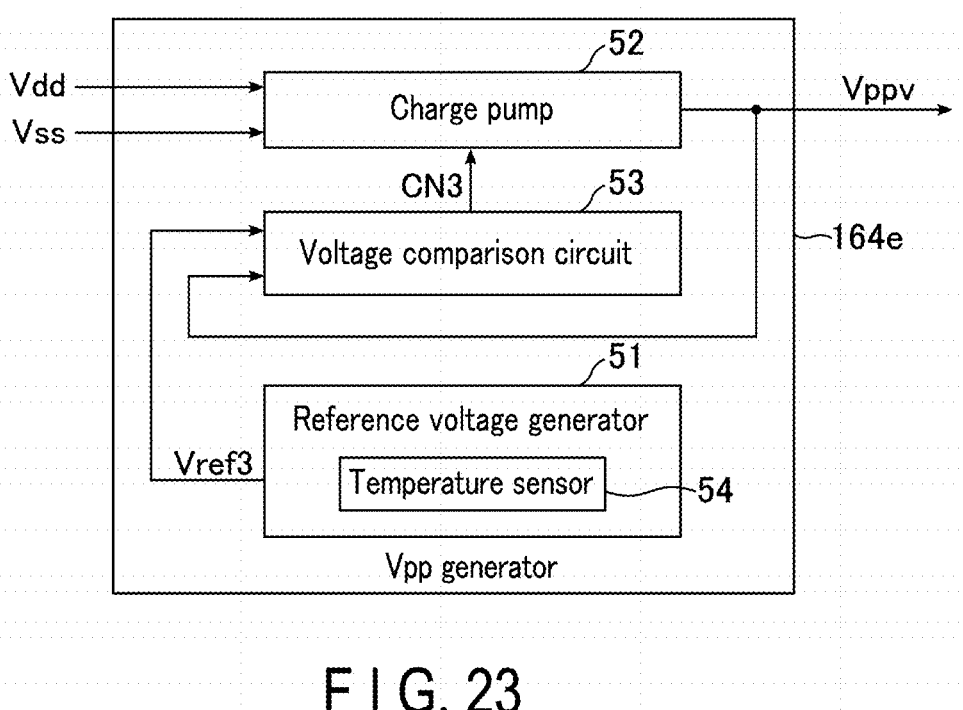
F I G. 23

MEMORY DEVICE

CROSS-REFERENCE TO RELATED APPLICATIONS

This application is based upon and claims the benefit of priority from Japanese Patent Application No. 2023-155503, filed Sep. 21, 2023, the entire contents of which are incorporated herein by reference.

FIELD

Embodiments described herein relate generally to a memory device.

BACKGROUND

A dynamic random access memory (DRAM) is known as a memory device. The memory cell of the DRAM includes a capacitor and a transistor. The memory cell holds data based on charge accumulated in the capacitor. A voltage based on the data of the memory cell from which the data is read is amplified by a sense amplifier, whereby the stored data is distinguished.

BRIEF DESCRIPTION OF THE DRAWINGS

FIG. 1 illustrates components of a memory device and coupling of the components according to a first embodiment.

FIG. 2 illustrates components of a core circuit and coupling of the components in the memory device according to the first embodiment.

FIG. 3 illustrates some components of a sub-core circuit and coupling of the components in the memory device according to the first embodiment.

FIG. 4 illustrates an example of components of a memory cell array and connection of the components in the memory device according to the first embodiment.

FIG. 5 illustrates another example of components of the memory cell array and connection of the components in the memory device according to the first embodiment.

FIG. 6 schematically illustrates an example of a structure of the memory cell array in the memory device according to the first embodiment.

FIG. 8 illustrates some components of a voltage generator and a driver and coupling of the components in the memory device according to the first embodiment.

FIG. 9 illustrates several interconnects, nodes, and signal potentials of the memory device according to the first embodiment along time.

FIG. 10 illustrates a first example of one state during operation of the memory device according to the first embodiment.

FIG. 11 illustrates a second example of one state during operation of the memory device according to the first embodiment.

FIG. 12 shows potential differences in the memory devices of a comparative example and the first embodiment.

FIG. 13 illustrates some components of a driver and coupling of the components in a memory device according to a second embodiment.

FIG. 14 illustrates several interconnects, nodes, and signal potentials of the memory device according to the second embodiment along time.

FIG. 15 illustrates some components of a driver and coupling of the components in a memory device according to a third embodiment.

FIG. 16 illustrates several interconnects, nodes, and signal potentials of the memory device according to the third embodiment along time.

FIG. 17 illustrates some components of a voltage generator and a driver and coupling of the components in a memory device according to a fourth embodiment.

FIG. 18 illustrates a relationship between a voltage and a temperature of the memory device according to the fourth embodiment.

FIG. 19 illustrates some components of the voltage generator and coupling of the components in the memory device according to the fourth embodiment.

FIG. 20 illustrates some components of a voltage generator and a driver and coupling of the components in a memory device according to a fifth embodiment.

FIG. 21 illustrates a relationship between a voltage and a temperature of the memory device according to the fifth embodiment.

FIG. 22 illustrates some components of a voltage generator and coupling of the components in the memory device according to the fifth embodiment.

FIG. 23 illustrates some components of the voltage generator and coupling of the components in the memory device according to the fifth embodiment.

DETAILED DESCRIPTION

Figure 7:
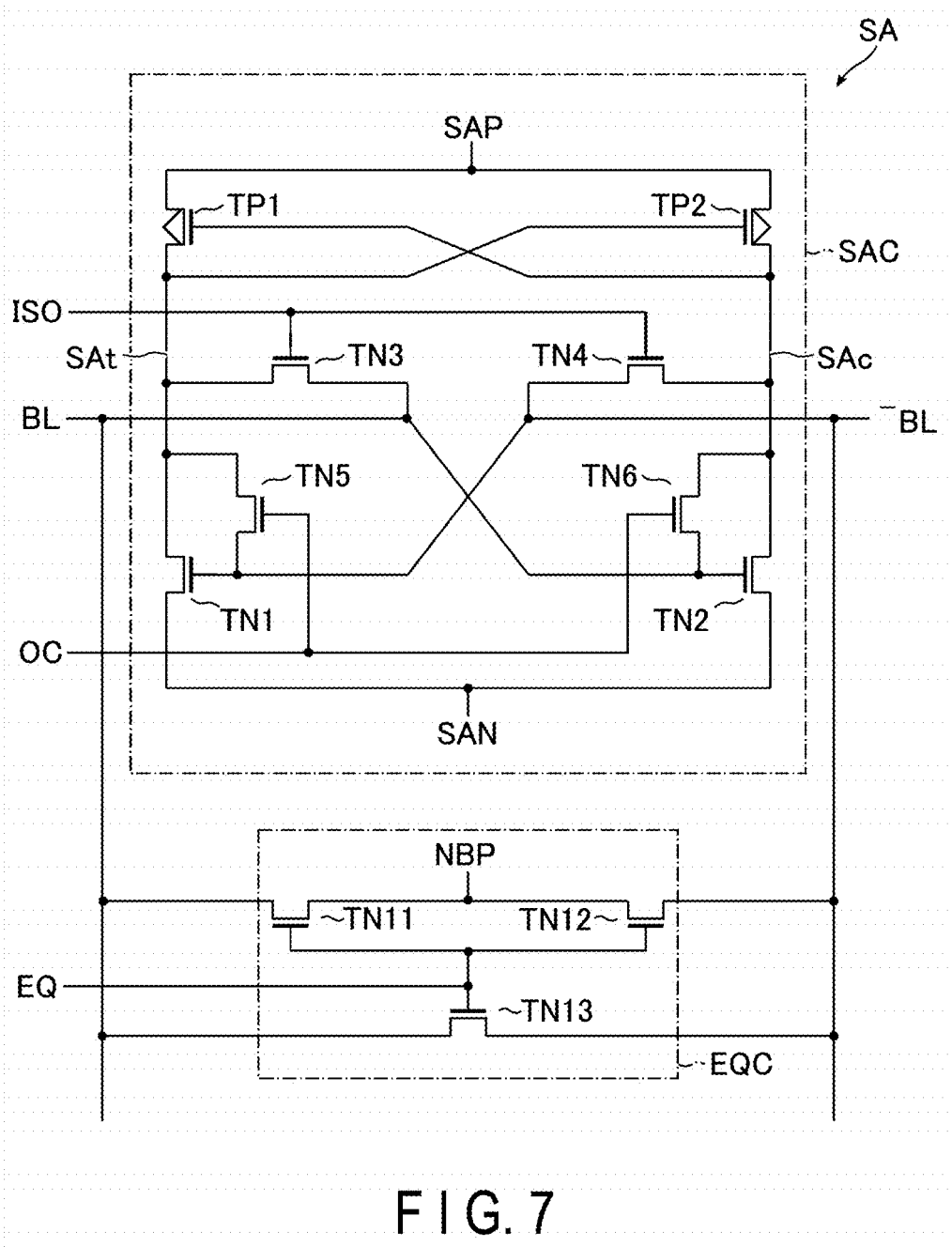
FIG. 7 illustrates some components of a sense amplifier and coupling of the components in the memory device according to the first embodiment.

In general, according to one embodiment, a memory device includes a transistor, a capacitor, a plate line, and a bit line. The transistor includes an oxide semiconductor and includes a first end, a second end, and a gate. The capacitor includes a third end and a fourth end. The fourth end is coupled to the second end. The plate line is coupled to the third end. The bit line is coupled to the first end. A second voltage lower than a first voltage is applied to the plate line during a first period over which the first voltage is applied to the gate. A fourth voltage higher than the second voltage is applied to the plate line during at least a part of a second period over which a third voltage lower than the first voltage is applied to the gate.

Embodiments will now be described with reference to the figures. In order to distinguish components having substantially the same function and configuration in an embodiment or over different embodiments from each other, an additional numeral or letter may be added to the end of each reference numeral or letter.

For an embodiment subsequent to an embodiment that has already been described, the description will concentrate mainly on the matters that constitute a difference from the already described embodiment. The entire description of a particular embodiment applies to another embodiment unless an explicit mention is made otherwise, or an obvious elimination is involved.

The specification and the claims, when mentioning that a particular (first) component is "coupled" to another (second) component, intend to cover both the form of the first component directly coupled to the second component and the form of the first component coupled to the second component via one or more components which are always or selectively conductive.

1. First Embodiment

1.1. Configuration (Structure)

1.1.1. Overall

FIG. 1 illustrates components of a memory device and coupling of the components according to a first embodiment. A memory device 1 is a device that stores data. The memory device 1 includes a core circuit 11, an input/output circuit 12, a control circuit 13, a decode circuit 14, a page buffer 15, a voltage generator 16, and a driver 17.

The core circuit 11 is a circuit including memory cells MC, interconnects for accessing the memory cells MC, and a peripheral circuit. Each memory cell MC is an element that stores data in a nonvolatile manner. The interconnects include word lines WL and bit lines BL. Each memory cell MC is coupled to a single word line WL and a single bit line BL. A single row address is allocated to the word line WL. A single column address is allocated to the bit line BL. A single memory cell MC is specified by selection of a single row and selection of a single column.

The input/output circuit 12 is a circuit that inputs and outputs data and signals. The input/output circuit 12 receives a control signal CNT, a command CMD, an address signal ADD, and data DAT to be written to the memory cell MC from the outside of the memory device 1, for example, from the memory controller. The data DAT to be written to the memory cell MC may be referred to as write data WD. The input/output circuit 12 transmits the data DAT read from the memory cell MC to the outside of the memory device 1, for example, to the memory controller. The data DAT read from the memory cell MC may be referred to as read data RD. In one example, the input/output circuit 12 is compliant with a double data rate 5 (DDR5).

The control circuit 13 is a circuit that controls the overall operation of the memory device 1. The control circuit 13 receives the command CMD and the control signal CNT from the input/output circuit 12. The control circuit 13 controls the core circuit 11 based on control instructed by the command CMD and the control signal CNT, and controls read of data from the memory cell MC and writing of data to the memory cell MC. The control circuit 13 controls the voltage generator 16 and the driver 17 based on the control instructed by the command CMD and the control signal CNT.

The decode circuit 14 is a circuit that decodes the address signal ADD. The decode circuit 14 receives the address signal ADD from the input/output circuit 12. The address signal ADD includes a set of a row address and a column address specifying a memory cell MC from which data is to be read or to which data is to be written. The decode circuit 14 decodes the address signal ADD, and generates a signal for selecting a memory cell MC from which data is to be read or to which data is to be written based on a result of the decoding. The generated signal is transmitted to the core circuit 11.

The page buffer 15 is a circuit that temporarily stores data of a certain size. In a case where data is written to the memory cell MC, the page buffer 15 receives write data WD from the input/output circuit 12, temporarily stores the write data WD, and transfers the write data WD to the core circuit 11. In a case where data is read from the memory cell MC, the page buffer 15 receives read data RD from the core circuit 11, temporarily stores the read data RD, and transfers the stored read data RD to the input/output circuit 12.

The voltage generator 16 is a circuit that generates various voltages used in the memory device 1. The voltage generator 16 receives power supply voltage Vdd and ground (or, common) voltage Vss, and generates a voltage based on control by the control circuit 13 by using the power supply voltage Vdd and the ground voltage Vss. The ground voltage Vss is 0 V. The power supply voltage Vdd and the ground voltage Vss are power supply voltages received by the memory device 1 from the outside. Alternatively, the power supply voltage Vdd and the ground voltage Vss are internal power supply voltages generated from a power supply voltage received by the memory device 1 from the outside and used throughout the memory device 1.

The driver 17 is a circuit that controls application of voltages to the interconnects in the core circuit 11. The driver 17 receives voltages from the voltage generator 16 and applies the received voltages to the core circuit 11 under the control of the control circuit 13.

1.1.2. Core Circuit

FIG. 2 illustrates components of a core circuit and coupling of the components in the memory device according to the first embodiment. As illustrated in FIG. 2, the core circuit 11 includes a sub-core circuit group SCCG.

The sub-core circuit group SCCG is a set of a plurality of sub-core circuits SCC. Each sub-core circuit SCC is a circuit including a plurality of memory cells MC, interconnects for accessing the memory cells MC, and a peripheral circuit. The interconnects includes words line WL and bit lines BL.

Each sub-core circuit SCC receives a row address and a column address. The row address includes information specifying one of the plurality of sub-core circuit groups SCCG and information specifying one of the plurality of sub-core circuits SCC. When a sub-core circuit group SCCG receives a row address including information specifying the sub-core circuit group SCCG, the sub-core circuit group SCCG enters a selected state. The sub-core circuit groups SCCG other than the sub-core circuit group SCCG in the selected state remain in a non-selected state.

The sub-core circuits SCC other than the sub-core circuit SCC in the selected state remain in a non-selected state.

In one example, the information for specifying the sub-core circuit group SCCG is a value of a plurality of upper bits of the row address, and the information for specifying the sub-core circuit SCC is a value of a plurality of middle bits of the row address. Information of a plurality of lower bits of the row address specifies a single word line WL. In this case, the sub-core circuits SCC belonging to a certain sub-core circuit group SCCG have a common value in bits specifying the sub-core circuit group SCCG in the row address. On the other hand, the plurality of sub-core circuits SCC belonging to different sub-core circuit groups SCCG may have different values in bits specifying the sub-core circuit group SCCG in the row address, and may have common values in bits specifying the sub-core circuit SCC in the row address.

FIG. 3 illustrates some components of a sub-core circuit and coupling of the components in the memory device according to the first embodiment. The sub-core circuits SCC have the same configuration. Each sub-core circuit SCC includes a memory cell array MCA, a plurality of word lines WL, a plurality of bit lines BL, a plate line PL, a row selector RS, a column selector CS, and a sense amplifier.

The memory cell array MCA is a set of a plurality of arranged memory cells MC. In the memory cell array MCA, the plurality of word lines WL, the plurality of bit lines BL, and the plate line PL are also arranged.

The row selector RS is a circuit for selecting a single row of the memory cell array (or, a corresponding memory cell array) MCA of the sub-core circuit SCC including the row selector RS. The row selector RS receives the row address and brings one of the word lines WL into a selected state based on the received row address. When the row selector RS receives the row address specifying the sub-core circuit SCC and the sub-core circuit group SCCG including the row selector RS, the row selector RS selects one of the word lines WL based on the received row address. The row selector RS includes a plurality of switches.

The sense amplifier SA amplifies a potential on the bit line BL in order to determine the data stored in the memory cell MC from which data is to be read during the data read. The sense amplifier SA amplifies the potentials on the plurality of bit lines BL.

The column selector CS is a circuit for selecting a single column of the memory cell array (or, a corresponding memory cell array) MCA of the sub-core circuit SCC including the column selector CS. The column selector CS receives the column address and outputs one of the potentials (or, data) corresponding to the plurality of bit lines BL stored in the sense amplifier SA based on the received column address. The column selector CS includes a plurality of switches.

1.1.2.1. Memory Cell Array

FIG. 4 illustrates an example of components of a memory cell array and connection of the components in the memory device according to the first embodiment. The memory cell array MCA includes a plurality of memory cells MC. In the memory cell array MCA, M word lines WL_0 to WL_M−1, N bit lines BL_0 to BL_N−1, and the plate line PL are also disposed. M and N are positive integers.

As described above with reference to FIG. 1 and as shown in FIG. 4, each memory cell MC is coupled with a single word line WL and a single bit line BL. Each memory cell MC is further coupled to the plate line PL. Each memory cell MC includes a cell capacitor CC and a cell transistor CT. The cell transistor CT is an n-type metal-oxide-semiconductor field-effect transistor (MOSFET) CT. Hereinafter, one of the source and the drain of the transistor may be referred to as one end of the transistor, and the other may be referred to as the other end of the transistor.

The cell capacitor CC is coupled to the plate line PL at one end, and is coupled to one end of the cell transistor CT at the other end. The cell capacitor CC stores data using charges accumulated at a node coupled to the cell transistor CT. A node coupled to the cell transistor CT of the cell capacitor CC may be hereinafter referred to as a storage node SN.

A state of whether or not the storage node SN accumulates charges is associated with a state in which the memory cell MC stores "1" data or a state in which the memory cell MC stores "0" data. Hereinafter, as an example, a state in which the potential of the storage node SN is charged to a relatively positive potential with respect to the potential of the plate line PL is treated as a state in which the memory cell MC stores "1" data, and a state in which the potential of the storage node SN is charged to a relatively negative potential with respect to the potential of the plate line PL is treated as a state in which the memory cell MC stores "0" data.

The cell transistor CT is coupled to a single bit line BL at the other end, and is coupled to one word line WL at a gate. The semiconductor configuring a part of the cell transistor CT provides at least a region (channel region) in which a channel is formed. The semiconductor includes or consists substantially of an oxide semiconductor. The description in the present specification and claims, when using a phrase "consisting substantially of" or similar phrases with an expression "substantially", shall be taken to mean that an inclusion of unintended impurities in a component resulting from "consisting substantially of" is tolerated. The oxide semiconductor refers to an oxide having semiconductor characteristics. Examples of the oxide semiconductor include an oxide containing one or more of indium (In), gallium (Ga), aluminum (Al), zinc (Zn), and tin (Sn). In one example, the oxide semiconductor includes, for example, In, Ga, Zn, and O. In another example, the oxide semiconductor includes In, Al, Zn, and O.

FIG. 5 illustrates another example of components of the memory cell array and connection of the components in the memory device according to the first embodiment. The memory cell array MCA may have a hierarchical structure as illustrated in FIG. 5. As illustrated in FIG. 5, P global bit lines GBL_0 to GBL_P−1, N selected lines SBL_0 to SBL_N−1, M word lines WL_0 to WL_M−1, and N sets of bit lines BL_0 to BL_N−1 are arranged in the memory cell array MCA. The set of bit lines BL_0 includes P bit lines BL_0. Similarly, for all cases where a is an integer value from 1 to N−1 inclusive, the set of bit lines BL_α includes P bit lines BL_α.

Each global bit line GBL is coupled to the bit line BL_0 through a select transistor GTO. Similarly, for all cases where β is an integer value from 1 to N−1 inclusive, each global bit line GBL is coupled to the bit line BL_β through a select transistor GT B. Gates of the P select transistors GT_0 coupled to the global bit lines GBL_0 to GBL_P−1 are coupled to the selected line SBL_0. Similarly, the gates of the P select transistors GT B coupled to the global bit lines GBL_0 to GBL_P−1 are coupled to the selected line SBL_β for all cases where β is an integer value from 1 to N−1 inclusive.

FIG. 6 schematically illustrates an example of a structure of the memory cell array in the memory device according to the first embodiment. FIG. 6 shows a structure for realizing a memory cell array of the type shown in FIG. 5. As illustrated in FIG. 6, the memory cells MC are arranged three-dimensionally. A structure of the memory cell array MCA includes a plurality of sub-structures 20. The sub-structures 20 are arranged in the Y direction. Each sub-structure 20 includes a plurality of memory cells MC, a plurality of switches SW1, a plurality of switches SW2, a plurality of conductors 22, a plurality of conductors 23, and conductors 24, 25, and 26.

Each sub-structure 20 includes a set of a plurality of memory cells MC arranged in the X direction. The plurality of memory cells MC arranged in the X direction configures a memory cell set MCS. Each memory cell MC in the memory cell set MCS is coupled to a single conductor 21 at a gate of a cell transistor CT (not illustrated). The conductor 21 functions as the word line WL. The conductor 21 extends in the X direction.

Each memory cell MC in the memory cell set MCS is coupled to a single conductor 22 at one end of a cell capacitor CC (not illustrated). The conductor 22 functions as a part of the plate line PL. The conductor 22 extends in the X direction.

Each conductor 21 is coupled to one end of the switch SW1 at one end. In one example, the switch SW1 is a MOSFET. The other end of the switch SW1 is coupled to the conductor 25. The conductor 25 is coupled to the voltage generator 16 and receives, for example, a voltage applied to the non-selected word line WL.

The other end of the conductor 21 is coupled to one end of the switch SW2. In one example, the switch SW2 is a MOSFET. The other end of the switch SW2 is coupled to the conductor 26. The conductor 26 is coupled to the voltage generator 16 and receives, for example, a voltage applied to the selected word line WL.

A plurality of sets including a single memory cell set MCS, the conductor 21 and the conductor 22 coupled to the memory cell set MCS, and the switches SW1 and SW2 coupled to the conductor 21 is provided in the Z direction.

A plurality of memory cells MC arranged in the Z direction is coupled to a single conductor 23 at one end of each cell transistor CT. The conductor 23 extends in the Z direction. The conductor 23 functions as the bit line BL.

The plurality of conductors 22 arranged in the Z direction is coupled to the conductor 24. The conductor 24 functions as a part of the plate line PL. The conductor 22 and the conductor 24 may be provided integrally, and for example, may spread in a planar shape in the X direction and the Z direction.

Each conductor 23 is coupled to one end of a single select transistor GT at an upper end in the Z direction. A plurality of select transistors GT arranged in the X direction is coupled to the conductor 28 at respective gates. The conductor 28 extends in the X direction. The conductor 28 functions as a selected line SBL.

Each select transistor GT is coupled to a conductor 29 at the other end. The conductor 29 is located above the select transistors GT. The conductor 29 extends in the Y direction. The conductor 29 functions as a global bit line GBL.

1.1.2.2. Sense Amplifier

FIG. 7 illustrates some components of a sense amplifier and coupling of the components in the memory device according to the first embodiment. As illustrated in FIG. 7, each sense amplifier SA includes a sense amplifier circuit SAC and an equalizer circuit EQC.

The sense amplifier circuit SAC is a circuit that amplifies a potential on the bit line BL in order to determine data stored in the memory cell MC to be read. The sense amplifier circuit SAC receives the power supply voltage Vdd and the ground voltage Vss from the voltage generator 16, and operates using the received voltages. The sense amplifier circuit SAC is coupled to a single bit line BL and a single complementary bit line ⁻BL. The complementary bit line ⁻BL functions as a node having a reference potential. The reference potential is used to determine data stored in the memory cell MC from which data is to be read.

The equalizer circuit EQC is a circuit that applies a voltage of a certain magnitude to a circuit coupled to the equalizer circuit EQC. The equalizer circuit EQC is coupled to a single bit line BL and a single complementary bit line ⁻BL. The equalizer circuit EQC receives a signal EQ and is enabled or disabled based on the signal EQ. While enabled, the equalizer circuit EQC applies a precharge voltage to both the bit line BL and the complementary bit line ⁻BL. The precharge voltage has a magnitude between the power supply voltage Vdd and the ground voltage Vss, for example, a magnitude of (Vdd−Vss)/2, that is, a magnitude of Vdd/2. The signal EQ is supplied from the control circuit 13.

Hereinafter, an example of details of the sense amplifier SA will be described. The sense amplifier circuit SAC includes p-type MOSFETS TP1 and TP2 and n-type MOS- FETS TN1, TN2, TN3, TN4, TN5, and TN6. The equalizer circuit EQC includes transistors TN11, TN12, and TN13.

The transistor TP1 is coupled between a node SAP and a node SAt. In one example, the node SAP receives a voltage from the voltage generator 16. In one example, the node SAP receives the power supply voltage Vdd. The transistor TP1 is coupled to a node SAc at a gate.

The transistor TN1 is coupled between the node SAt and a node SAN. In one example, the node SAN receives a voltage from the voltage generator 16. In one example, the node SAN receives the ground voltage Vss. The transistor TN1 is coupled to a complementary bit line ⁻BL at the gate.

The transistor TP2 is coupled between the node SAP and the node SAc. The transistor TP2 is coupled to the node SAt at the gate.

The transistor TN2 is coupled between the node SAc and the node SAN. The transistor TN2 is coupled to the bit line BL at a gate.

The transistor TN3 is coupled between the node SAt and the bit line BL. The transistor TN3 receives a signal ISO at a gate. In one example, the signal ISO is supplied from the control circuit 13.

The transistor TN4 is coupled between the node SAc and the complementary bit line ⁻BL. The transistor TN4 receives the signal ISO at a gate.

The transistor TN5 is coupled between the node SAt and the gate of the transistor TN1. The transistor TN5 receives a signal OC at a gate. In one example, a signal OC is supplied from the control circuit 13.

The transistor TN6 is coupled between the node SAc and a gate of the transistor TN2. The transistor TN6 receives the signal OC at a gate.

The transistor TN11 is coupled between the bit line BL and a node NBP. The node NBP receives a precharge voltage from the voltage generator 16. The precharge voltage is (Vdd−Vss)/2, i.e., Vdd/2, which also serves as a reference voltage. The transistor TN11 receives the signal EQ at a gate. The signal EQ is supplied from the control circuit 13, for example.

The transistor TN12 is coupled between the complementary bit line ⁻BL and the node NBP. The transistor TN12 receives the signal EQ at a gate.

The transistor TN13 is coupled between the bit line BL and the complementary bit line ⁻BL. The transistor TN13 receives the signal EQ at a gate.

The transistors TN5 and TN6 are provided to correct variations between a threshold voltage of the transistor TN1 and a threshold voltage of the transistor TN2, and are not necessarily provided. In addition, it is not essential to provide the transistors TN3 and TN4. Therefore, the transistors TN3, TN4, TN5, and TN6 may be omitted. In this case, the gate of the transistor TP1 is coupled to the complementary bit line ⁻BL, and the gate of the transistor TP2 is coupled to the bit line BL.

1.1.3. Voltage Generator

FIG. 8 illustrates some components of a voltage generator and a driver and coupling of the components in the memory device according to the first embodiment.

As illustrated in FIG. 8, the voltage generator 16 includes a Vdd/2 generator 161, a Vnn generator 163, a Vpp generator 164, and a Vdd/2 generator 165.

The Vdd/2 generator 161 is a circuit that generates a voltage Vdd/2 from the voltage received by the memory device 1. In one example, the Vdd/2 generator 161 includes a regulator circuit. The Vdd/2 generator 161 is enabled or disabled by a control signal EN1. The control signal EN1 is supplied from the control circuit 13.

The Vnn generator 163 is a circuit that generates a voltage Vnn from the voltage received by the memory device 1. The voltage Vnn is lower than the ground voltage Vss and is a negative voltage. In one example, the Vnn generator 163 includes a charge pump circuit. The Vnn generator 163 is enabled or disabled by a control signal EN2. The control signal EN2 is supplied from the control circuit 13.

The Vpp generator 164 is a circuit that generates a voltage Vpp from the voltage received by the memory device 1. The voltage Vpp is higher than the power supply voltage Vdd. In one example, the Vpp generator 164 includes a charge pump circuit. The Vpp generator 164 is enabled or disabled by a control signal EN3. The control signal EN3 is supplied from the control circuit 13.

The Vdd/2 generator 165 is a circuit that generates a voltage Vdd/2 from the voltage received by memory device 1. In one example, the Vdd/2 generator 165 includes a regulator circuit. The Vdd/2 generator 165 supplies the voltage Vdd/2 to the equalizer circuit EQC. The Vdd/2 generator 165 is enabled or disabled by a control signal EN4. The control signal EN4 is supplied from the control circuit 13.

The driver 17 includes PL driver circuits 171 and 172 and WL driver circuits 173 and 174.

The PL driver circuits 171 and 172 are circuits that control the voltage of the plate line PL. The PL driver circuit 171 receives the voltage Vdd/2 from the Vdd/2 generator 161. The PL driver circuit 171 is enabled or disabled under the control of the control circuit 13. While enabled, the PL driver circuit 171 applies the voltage Vdd/2 to the plate line PL.

The PL driver circuit 172 receives the power supply voltage Vdd. The PL driver circuit 172 is enabled or disabled under the control of the control circuit 13. While enabled, the PL driver circuit 172 applies the power supply voltage Vdd to the plate line PL. With only one of the PL driver circuits 171 and 172 enabled, the voltage received by the enabled PL driver circuit 171 or 172 is applied to the plate line PL.

The WL driver circuit 173 receives the voltage Vnn from the Vnn generator 163. The WL driver circuit 173 is enabled or disabled under the control of the control circuit 13. While enabled, the WL driver circuit 173 applies the voltage Vnn to the word line WL.

The WL driver circuit 174 receives the voltage Vpp. The WL driver circuit 174 is enabled or disabled under the control of the control circuit 13. While enabled, the WL driver circuit 174 applies the voltage Vpp to the word line WL. With only one of the WL driver circuits 173 and 174 enabled, the voltage received by the enabled WL driver circuit 173 or 174 is applied to the word line WL.

1.2. Operation

FIG. 9 illustrates several interconnects, nodes, and signal potentials of the memory device according to the first embodiment along time. In the following description, the potentials of the interconnect, the node, and the signal are maintained until a time at which transition to another magnitude is described.

The memory cell MC as a data read target may be referred to as a selected memory cell MC. The word line WL whose potential is shown in FIG. 9 is a word line WL coupled to the selected memory cell MC, and hereinafter may be referred to as a selected word line WL. In FIG. 9, the potentials of the word lines WL (non-selected word lines WL) other than the word line WL coupled to the selected memory cell MC are also indicated by broken lines.

The bit line BL whose potential is shown in FIG. 9 is a bit line BL coupled to the selected memory cell MC during data read, and may be referred to as a selected bit line BL hereinafter. A complementary bit line ⁻BL whose potential is shown in FIG. 9 is a complementary bit line ⁻BL coupled to the selected bit line BL through the sense amplifier circuit SAC. With a voltage applied to the interconnect illustrated in the drawings or the interconnect that transmits a signal, the interconnect has substantially the same potential as the applied voltage. For example, the power supply voltage Vdd is applied to a certain interconnect for the interconnect having the power supply potential Vdd. The signal EQ whose potential is shown in FIG. 9 is a signal EQ supplied to the equalizer circuit EQC of the sense amplifier SA coupled to the selected bit line BL.

Hereinafter, a case where the selected memory cell MC stores "0" data may be referred to as a "O" data storage case, and a case where the selected memory cell MC stores "1" data may be referred to as a "1" data storage case.

At the start of the period shown in FIG. 9, each interconnect and signal has a potential described below. The word line WL has a potential Vnn. Therefore, the cell transistor CT of the selected memory cell MC is off. The potential Vnn is used to apply a large reverse bias to the cell transistor CT to suppress the leakage current of the cell transistor CT.

The signal EQ has a power supply potential Vdd. Therefore, the transistors TN11 and TN12 are on. Therefore, in both the "O" data storage case and the "1" data storage case, the bit line BL and the complementary bit line ⁻BL are precharged (or, equalized) and have a potential Vdd/2.

The plate line PL has a potential Vdd/2. This is performed by enabling the PL driver circuit 171 and disabling other driver circuits (including the PL driver circuit 172) coupled to the plate line PL.

A period from time t1 to time t6 is a read period. At time t1, the signal EQ is set to the ground potential Vss. As a result, the precharge ends, and the bit line BL and the complementary bit line ⁻BL have independent potentials.

At time t2, the voltage Vpp is applied to the word line WL. The voltage Vpp is higher than the ground voltage Vss and has a magnitude that turns on the cell transistor CT. With the application of the voltage Vpp, the potential of the word line WL continues to rise to the potential Vpp from time t2.

The potential of the word line WL continues to rise, and the cell transistor CT of the memory cell MC is turned on at time t3. As a result, charge sharing starts. By the charge sharing, the charge accumulated in the bit line BL and the charge accumulated in the storage node SN of the selected memory cell MC are shared. As a result, the potential of the bit line BL rises or falls based on the data stored in the selected memory cell MC.

In the "0" data storage case, the potential of the bit line BL falls toward the potential of the storage node SN, and the potential of the storage node SN rises toward the potential of the bit line BL. The bit line BL and the storage node SN come to be in a state of having a potential of a magnitude where the falling potential of the bit line BL and the rising potential of the storage node SN become equal. The potential of the complementary bit line ⁻BL is maintained.

In the "1" data storage case, the potential of the storage node SN falls toward the potential of the bit line BL, and the potential of the bit line BL rises toward the potential of the storage node SN. The bit line BL and the storage node SN come to be in a state of having a potential of a magnitude where the rising potential of the bit line BL and the falling potential of the storage node SN become equal. The potential of the complementary bit line ⁻BL is maintained.

At time t4, the sense amplifier circuit SAC is enabled. As a result, the potential having the higher potential of the bit line BL and the complementary bit line ⁻BL rises to the power supply potential Vdd, and the potential having the lower potential bit line falls to the ground potential Vss.

At time t5, the voltage Vnn is applied to the word line WL. With the application of the voltage Vnn, the potential of the word line WL continues to fall to the potential Vnn from time t5. As a result, the cell transistor CT of the selected memory cell MC is turned off.

During a period from time t1 to time t5, the potential of the word line WL other than the word line WL coupled to the selected memory cell MC, that is, the non-selected word line WL is maintained at the potential Vnn.

A period after time t6 is a period of precharge (or, equalize). At time t6, the potential of the signal EQ is set to the power supply potential Vdd. Furthermore, at time t6, the sense amplifier circuit SAC is disabled.

The potential of the signal EQ rises, and the transistors TN11 and TN12 are turned on at time t7. As a result, the bit line BL and the complementary bit line ⁻BL are precharged to the potential Vdd/2.

At time t8, the potential of the plate line PL is raised. As a result, since the storage node SN is in a floating state, the potential of the storage node SN rises by the same magnitude as the magnitude of the rising in the potential of the plate line PL due to capacitive coupling between the storage node SN and the plate line PL through the cell capacitor CC. In one example, the potential of the plate line PL is set to the power supply potential Vdd. Therefore, the potential of the plate line PL rises by Vdd/2. The following description is based on this example. As the potential of the plate line PL rises, the potential of the storage node SN rises by a magnitude of Vdd/2. In the "0" data storage case, the magnitude of the potential of the storage node SN is Vdd/2. In the "1" data storage case, the magnitude of the potential of the storage node SN is Vdd+Vdd/2.

At time t9, the potential of the plate line PL is set to the potential Vdd/2. As a result, the potential of the storage node SN in the floating state falls by the magnitude of Vdd/2 due to the capacitive coupling between the storage node SN and the plate line PL through the cell capacitor CC. As a result of the change in the voltage of the signal at time t9, the potentials of the interconnects, the nodes, and the signals return to the potential at the start of the period illustrated in FIG. 9.

The change of the potential of the plate line PL to the potential Vdd/2 at time t9 is performed if the memory device 1 receives a command related to the start of data read after time t8. That is, if the memory device 1 receives the command related to the start of the data read, the control circuit 13 sets the potential of the plate line PL to the potential Vdd/2 for the purpose of starting the data read similarly to the data read from time t1. The command related to the start of data read is an active command based on an example in which the input/output circuit 12 is compliant with the DDR5.

The control described above with reference to FIG. 9 may be applied to the sub-core circuit SCC other than the sub-core circuit SCC including the selected memory cell MC. However, in the sub-core circuit SCC not including the selected memory cell MC, as described above, the potential of the word line WL is maintained at the potential Vnn as an example. Hereinafter, the sub-core circuit SCC including the selected memory cell MC may be referred to as a selected sub-core circuit SCC_s. The sub-core circuits SCC other than the selected sub-core circuit SCC_s may be referred to as a non-selected sub-core circuit SCC_n.

In one example, while the potential of the plate line PL is set to the power supply potential Vdd, the Vdd/2 generator 161 is disabled.

FIG. 10 illustrates a first example of one state during operation of the memory device according to the first embodiment. As illustrated in FIG. 10, all the non-selected sub-core circuits SCC_n in the selected sub-core circuit group SCCG_s are made to have the potential of the plate line PL as the potential Vdd during precharge. In addition, the potential of the plate line PL of all the non-selected sub-core circuits SCC_n in the selected sub-core circuit group SCCG_s is set to Vdd also during the data read from the selected sub-core circuit SCC_s.

FIG. 11 illustrates a second example of one state during the operation of the memory device according to the first embodiment. The second example relates to a sub-core circuit group SCCG other than the selected sub-core circuit group SCCG_s. The sub-core circuit group SCCG other than the selected sub-core circuit group SCCG_s may be referred to as a non-selected sub-core circuit group SCCG_n.

As illustrated in FIG. 11, in addition to all the non-selected sub-core circuits SCC_n of the selected sub-core circuit group SCCG_s illustrated in FIG. 10, all the sub-core circuits SCC_n of the non-selected sub-core circuit group SCCG_n are made to have the potential of the plate line PL as the potential Vdd during precharge. In addition, the potential of the plate line PL of all the sub-core circuits SCC_n of the non-selected sub-core circuit group SCCG_n is set to Vdd also during data read from the selected sub-core circuit SCC_s.

1.3. Advantages (Advantageous Effects)

According to the first embodiment, it is possible to provide a memory device having high data retention performance as described below.

Data retention performance during precharge of a memory cell of a DRAM (hereinafter, it may be referred to as an oxide semiconductor DRAM) including a transistor including an oxide semiconductor as a region in which a channel is formed depends on a potential difference Vgs between a gate and a source of the cell transistor, not a potential difference Vds between the source and a drain of the cell transistor. That is, as illustrated in FIG. 12 as a comparative example, in the "1" data storage case, the potential difference Vds is Vdd−Vdd/2 since the storage node SN has the power supply potential Vdd and the bit line BL has the potential Vdd/2. In the "0" data storage case, the potential difference Vds is Vdd/2 because the storage node SN has the ground potential Vss and the bit line BL has the potential Vdd/2. In the "1" data storage case and the "0" data storage case, a potential difference between the source and the drain of the cell transistor CT is the same.

On the other hand, in the "1" data storage case, the potential difference Vgs is Vnn−Vdd/2 since the gate (that is, the word line WL) has the potential Vnn and the source (that is, the bit line BL) has the potential Vdd/2. Therefore, since a large reverse bias of Vnn−Vdd/2 is applied between the gate and the source, a current leaking through the cell transistor CT is small. In the "0" data storage case, the potential difference Vgs is Vnn−Vss since the gate has the potential Vnn and the source (that is, the storage node SN) has the potential Vss.

Vnn–Vss in the "O" data storage case is less than Vnn–Vdd/2 in the "1" data storage case. Therefore, the reverse bias applied between the gate and the source is small, and the leakage current can flow through the cell transistor CT. The leakage current deteriorates data retention performance of the memory cell. Therefore, in order to improve the data retention performance of the memory cell, it is desired to improve the retention performance in the "0" data storage case.

According to the first embodiment, the potential of the plate line PL is set to the power supply potential Vdd during precharge. Therefore, during precharge, the potential of the storage node SN has a magnitude of Vdd/2 in the "0" data storage case, and has a magnitude of Vdd+Vdd/2 in the "1" data storage case. In the "O" data storage case, since the gate of the cell transistor CT has the potential Vnn and the magnitude of the potential of the source is Vdd/2, the potential difference Vgs is Vnn–Vdd/2. This has a negative absolute value larger than Vnn–Vss in the comparative example. Therefore, the current leaking through the cell transistor CT is suppressed as compared with the case of the comparative example, and the memory device 1 has high data retention performance. The "1" data storage case of the first embodiment is the same as that of the comparative example.

According to the first embodiment, the potential of the plate line PL is set to the power supply potential Vdd during precharge. Therefore, during precharge, the Vdd/2 generator 161 can be disabled. Operation by the Vdd/2 generator 161 for generating the voltage Vdd/2 consumes current. Therefore, the current consumption is smaller in a case where the power supply potential Vdd is applied with the Vdd/2 generator 161 disabled. Therefore, the current consumption during precharge is suppressed, and the current consumption of the memory device 1 is suppressed. In addition, since it is not necessary to apply the potential Vdd/2 to a large number of word lines WL, the Vdd/2 generator 161 does not need to have high capability (or capacitance), and an area of the Vdd/2 generator 161 may be small.

In the DDR5, a mode called Maximum Power Saving Mode (MPSM) is defined. The MPSM starts if a memory device in an idle state receives a command instructing entry into the MPSM. In the MPSM, the memory device consumes less current than current consumption in the idle state by stopping (or, disabling) operation of many components. On the other hand, the memory device in the MPSM does not guarantee the retention of the data stored before entering the MPSM. The memory device 1 has high data retention performance during precharge. Therefore, data can be guaranteed also in the MPSM.

2. Second Embodiment

A second embodiment is different from the first embodiment in terms of voltage applied to a word line WL during precharge.

FIG. 13 illustrates some components of a driver and coupling of the components in a memory device according to a second embodiment. FIG. 13 also shows a voltage generator 16. A driver 17b of a memory device 1b of the second embodiment further includes a WL driver circuit 177.

The WL driver circuit 177 receives a ground voltage Vss. The WL driver circuit 177 is enabled or disabled under the control of a control circuit 13. While enabled, the WL driver circuit 177 applies the ground voltage Vss to the word line WL. With only one of a WL driver circuit 173, a WL driver circuit 174, and the WL driver circuit 177 enabled, a voltage received by the enabled WL driver circuit 173, 174, or 177 is applied to the word line WL.

FIG. 14 illustrates several interconnects, nodes, and signal potentials of the memory device according to the second embodiment along time. At time t8, a potential of the word line WL is set to a ground potential Vss. As described above in the first embodiment, a potential of a plate line PL is set to a power supply potential Vdd during precharge, whereby a potential difference Vgs between a gate and a source of a cell transistor CT is large. Therefore, during precharge, data is maintained in a memory cell MC even if the potential of the word line WL is not as low as a potential Vnn. The potential of the word line WL is set to the potential Vnn at time t9.

In one example, while the potential of the word line WL is set to the ground potential Vss, a Vnn generator 163 is disabled.

According to the second embodiment, the potential of the plate line PL is set to the power supply potential Vdd during precharge. Therefore, the same advantages as those of the first embodiment can be obtained.

According to the second embodiment, the potential of the word line WL is set to the ground potential Vss during precharge. Since the potential of the plate line PL is set to the power supply potential Vdd during precharge, data is maintained in the memory cell MC even if the potential of the word line WL is not as low as the potential Vnn during precharge. Thus, during precharge, the Vnn generator 163 can be disabled. As a result, the current consumption during precharge is suppressed, and the current consumption of the memory device 1 is suppressed.

3. Third Embodiment

A third embodiment is different from the first embodiment in terms of voltage applied to a bit line BL during precharge.

FIG. 15 illustrates some components of a driver and coupling of the components in a memory device according to a third embodiment. FIG. 15 also shows a voltage generator 16. A driver 17c of a memory device 1c according to the third embodiment further includes a driver circuit 178.

The driver circuit 178 receives the power supply voltage Vdd. The driver circuit 178 is enabled or disabled under the control of a control circuit 13. While enabled, the driver circuit 178 applies the power supply voltage Vdd to a node NBP of an equalizer circuit EQC. With only one of the driver circuit 178 and a Vdd/2 generator 165 enabled, a voltage in the enabled driver circuit 178 or Vdd/2 generator 165 is applied to the node NBP of the equalizer circuit EQC.

FIG. 16 illustrates several interconnects, nodes, and signal potentials of the memory device according to the third embodiment along time. At time t8, the potential of the bit line BL is set to the power supply potential Vdd. As a result, the potential of a complementary bit line ‾BL is also set to the power supply potential Vdd.

In one example, while the potential of the bit line BL is set to the power supply potential Vdd, the Vdd/2 generator 165 is disabled.

According to the third embodiment, the potential of a plate line PL is set to the power supply potential Vdd during precharge. Therefore, the same advantages as those of the first embodiment can be obtained.

According to the third embodiment, the potential of the bit line BL is set to the ground potential Vdd during precharge. Therefore, during precharge, the Vdd/2 generator 165 can be disabled. As a result, since a regulator circuit of the Vdd/2 generator 165 can be stopped, the current consumption during precharge is suppressed, and the current consumption of the memory device 1 is suppressed.

The third embodiment may be combined with the second embodiment. In a case where the third embodiment is combined with the second embodiment, a Vdd/2 generator 161, a Vnn generator 163, a Vpp generator 164, and the Vdd/2 generator 165 can all be disabled during precharge. Therefore, the current consumption during precharge is further suppressed.

4. Fourth Embodiment

A fourth embodiment is additionally applied to the first, second, or third embodiment, and relates to a voltage applied to a plate line PL.

FIG. 17 illustrates some components of a voltage generator and a driver and coupling of the components in a memory device according to a fourth embodiment. FIG. 17 illustrates a case where the fourth embodiment is applied to the third embodiment as an example. As shown in FIG. 17, a voltage generator 16*d* of a memory device 1*d* according to the fourth embodiment further includes a Vp1 generator 167. The Vp1 generator 167 is a circuit that generates a voltage Vp1. The voltage Vp1 has a variable magnitude. The voltage Vp1 is applied to the plate line PL instead of the power supply voltage Vdd applied to the plate line PL in the first, second, or third embodiment.

A driver 17*d* of a memory device 1*d* further includes a PL driver circuit 179 instead of the PL driver circuit 172. The PL driver circuit 179 receives the voltage Vp1. The PL driver circuit 179 is enabled or disabled under the control of a control circuit 13. The PL driver circuit 179 applies the voltage Vp1 to the plate line PL while being enabled.

FIG. 18 illustrates a relationship between a voltage and a temperature of the memory device according to the fourth embodiment. As shown in FIG. 18, the voltage Vp1 depends on a temperature. The voltage Vp1 has a positive temperature coefficient, i.e. is higher as the temperature of the memory device 1 is higher. Therefore, a difference between the voltage Vp1 applied to the plate line PL during precharge (between time t8 and time t9 in FIG. 9) and a voltage Vdd/2 applied to the plate line PL during the other periods (between time t1 and time t8 and after time t9 in FIG. 9) is larger if the temperature of the memory device 1 is higher.

FIG. 19 illustrates some components of the voltage generator and coupling of the components in the memory device according to the fourth embodiment. As shown in FIG. 19, the Vp1 generator 167 includes a reference voltage generator 31, a charge pump 32, and a voltage comparison circuit 33.

The reference voltage generator 31 is a circuit that generates a reference voltage Vref1 that functions as a reference for generating the voltage Vp1. The reference voltage Vref1 has a variable magnitude. The reference voltage generator 31 includes a temperature sensor 34. The temperature sensor 34 generates a temperature signal based on a temperature of a position where the temperature sensor 34 is disposed. The reference voltage generator 31 generates the reference voltage Vref1 using the temperature signal of the temperature sensor 34. The reference voltage Vref1 has a positive temperature coefficient like the voltage Vp1, and has the same temperature coefficient as that of the voltage Vp1.

The charge pump 32 is a circuit that generates a voltage different from a voltage received by the charge pump 32 using the voltage received by the charge pump 32. The charge pump 32 receives a power supply voltage Vdd and a ground voltage Vss, and generates the voltage Vp1 using the power supply voltage Vdd and the ground voltage Vss. The charge pump 32 changes a magnitude of the voltage Vp1 based on a control signal CN1 from the voltage comparison circuit 33.

The voltage comparison circuit 33 is a circuit that compares voltages received by the voltage comparison circuit 33 and outputs a signal based on the comparison. The voltage comparison circuit 33 receives the voltage Vp1 and the reference voltage Vref1. In a case where the voltage Vp1 exceeds the reference voltage Vref1 by a certain magnitude or more, the voltage comparison circuit 33 supplies a control signal CN1 instructing a decrease in the magnitude of the voltage Vp1 to the charge pump 32. In a case where the voltage Vp1 is lower than the reference voltage Vref1 by the certain magnitude or more, the voltage comparison circuit 33 supplies the control signal CN1 instructing an increase in the magnitude of the voltage Vp1 to the charge pump 32.

According to the fourth embodiment, the voltage Vp1 has a positive temperature coefficient. Therefore, it is possible to provide the memory device 1*d* having high data retention performance even at a high temperature.

In the fourth embodiment, a voltage having a variable magnitude depending on the temperature may be applied instead of the power supply voltage Vdd applied to the bit line BL in the third embodiment. This variable voltage can have, for example, a positive temperature coefficient, and is higher as the temperature of the memory device 1 is higher. The variable voltage can be generated by a circuit having a configuration similar to that of the Vp1 generator 167, and the generated voltage is input to the driver circuit 178. Also with this configuration, a voltage applied between the gate and the source can be controlled, and the memory device 1*d* having high data retention performance even at a high temperature can be provided.

5. Fifth Embodiment

A fifth embodiment is additionally applied to the first, second, third, or fourth embodiment, and relates to a voltage applied to a word line WL.

FIG. 20 illustrates some components of a voltage generator and a driver and coupling of the components in a memory device according to a fifth embodiment. FIG. 20 illustrates a case where the fifth embodiment is applied to the fourth embodiment as an example. As illustrated in FIG. 20, a Vnn generator 163*e* of a memory device 1*e* according to the fifth embodiment generates a voltage Vnnv. The voltage Vnnv has a variable magnitude. A Vpp generator 164*e* of the memory device 1*e* according to the fifth embodiment generates a voltage Vppv. The voltage Vppv has a variable magnitude.

The WL driver circuit 173 receives the voltage Vnnv instead of the voltage Vnn. The WL driver circuit 174 receives the voltage Vppv instead of the voltage Vpp.

FIG. 21 illustrates a relationship between a voltage and a temperature of the memory device according to the fifth embodiment. As shown in FIG. 21, the voltage Vppv is dependent on the temperature. The voltage Vppv has a negative temperature coefficient, that is, is lower as the temperature of the memory device 1 is higher. The voltage Vnnv has a negative temperature coefficient. The temperature coefficient of the voltage Vppv is different from the temperature coefficient of the voltage Vnnv.

FIG. 22 illustrates some components of a voltage generator and coupling of the components in the memory device according to the fifth embodiment. As shown in FIG. 22, the Vnn generator 163e includes a reference voltage generator 41, a charge pump 42, and a voltage comparison circuit 43.

The reference voltage generator 41 is a circuit that generates a reference voltage Vref2 that functions as a reference for generating the voltage Vnnv. The reference voltage Vref2 has a variable magnitude. The reference voltage generator 41 includes a temperature sensor 44. The temperature sensor 44 generates a temperature signal based on the temperature of a position where the temperature sensor 44 is disposed. The reference voltage generator 41 generates the reference voltage Vref2 using the temperature signal of the temperature sensor 44. Like the voltage Vnnv, the reference voltage Vref2 has a negative temperature coefficient and has the same temperature coefficient as that of the voltage Vnnv.

The charge pump 42 is a circuit that generates a voltage different from the voltage received by the charge pump 42 using the voltage received by the charge pump 42. The charge pump 42 receives a power supply voltage Vdd and a ground voltage Vss, and generates the voltage Vnnv using the power supply voltage Vdd and the ground voltage Vss. The charge pump 42 changes a magnitude of the voltage Vnnv based on a control signal CN2 from the voltage comparison circuit 43.

The voltage comparison circuit 43 is a circuit that compares the voltages received by the voltage comparison circuit 43 and outputs a signal based on the comparison. The voltage comparison circuit 43 receives the voltage Vnnv and the reference voltage Vref2. In a case where the voltage Vnnv exceeds the reference voltage Vref2 by a certain magnitude or more, the voltage comparison circuit 43 supplies the control signal CN2 instructing a decrease in the magnitude of the voltage Vnnv to the charge pump 42. In a case where the voltage Vnnv is lower than the reference voltage Vref2 by the certain magnitude or more, the voltage comparison circuit 43 supplies the control signal CN2 instructing an increase in the magnitude of the voltage Vnnv to the charge pump 42.

FIG. 23 illustrates some components of the voltage generator and coupling of the components in the memory device according to the fifth embodiment. As shown in FIG. 23, the Vpp generator 164e includes a reference voltage generator 51, a charge pump 52, and a voltage comparison circuit 53.

The reference voltage generator 51 is a circuit that generates a reference voltage Vref3 that functions as a reference for generating the voltage Vnnv. The reference voltage Vref3 has a variable magnitude. The reference voltage generator 51 includes a temperature sensor 54. The temperature sensor 54 generates a temperature signal based on the temperature of a position where the temperature sensor 54 is disposed. The reference voltage generator 51 generates the reference voltage Vref3 using a temperature signal of the temperature sensor 54. The reference voltage Vref3 has a negative temperature coefficient as with the voltage Vppv, and has the same temperature coefficient as that of the voltage Vppv.

The charge pump 52 is a circuit that generates a voltage different from the voltage received by the charge pump 52 using the voltage received by the charge pump 52. The charge pump 52 receives the power supply voltage Vdd and the ground voltage Vss, and generates the voltage Vppv using the power supply voltage Vdd and the ground voltage Vss. The charge pump 52 changes the magnitude of the voltage Vppv based on the control signal CN3 from the voltage comparison circuit 53.

The voltage comparison circuit 53 is a circuit that compares the voltages received by the voltage comparison circuit 53 and outputs a signal based on the comparison. The voltage comparison circuit 53 receives the voltage Vppv and the reference voltage Vref3. In a case where the voltage Vppv exceeds the reference voltage Vref3 by a certain magnitude or more, the voltage comparison circuit 53 supplies a control signal CN3 instructing a decrease in the magnitude of the voltage Vppv to the charge pump 52. In a case where the voltage Vppv is lower than the reference voltage Vref3 by a certain magnitude or more, the voltage comparison circuit 53 supplies the control signal CN3 instructing an increase in the magnitude of the voltage Vppv to the charge pump 52.

An on-current of the transistor containing silicon has a negative temperature coefficient. The on-current is a current flowing between the source and the drain of the transistor while the transistor is on. On the other hand, the cell transistor CT containing an oxide semiconductor has a positive temperature coefficient. Therefore, at a high temperature, even if a voltage smaller than that at a low temperature is applied to the gate of the cell transistor CT, the cell transistor CT can flow a sufficient on-current. Based on this, according to the fifth embodiment, the voltages Vnnv and Vppv have negative temperature coefficients. Therefore, current consumption in the memory device 1e at a high temperature can be suppressed. In addition, since the voltage applied to the gate of the cell transistor CT at high temperature is suppressed, it is possible to improve the reliability of the cell transistor CT and eventually the reliability of the memory device 1e.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a transistor including an oxide semiconductor and including a first end, a second end, and a gate;
   a capacitor including a third end and a fourth end, the fourth end being coupled to the second end;
   a plate line coupled to the third end; and
   a bit line coupled to the first end;
   wherein a second voltage lower than a first voltage is applied to the plate line during a first period over which the first voltage is applied to the gate, and
   a fourth voltage higher than the second voltage is applied to the plate line during at least a part of a second period over which a third voltage lower than the first voltage is applied to the gate.

2. The memory device according to claim 1, further comprising a first voltage generator that generates the second voltage,
   wherein the first voltage generator is disabled at least during a period over which the fourth voltage is applied to the plate line.

3. The memory device according to claim 1,
   wherein a fifth voltage lower than the third voltage is applied to the gate after the first period, and the third voltage is applied to the gate after the application of the fifth voltage.

4. The memory device according to claim 3, wherein the third voltage is applied to the gate over at least a part of a period during which the fourth voltage is applied to the plate line.

5. The memory device according to claim 3, further comprising a second voltage generator that generates the fifth voltage, wherein the second voltage generator is disabled at least during a period in which the third voltage is applied to the gate.

6. The memory device according to claim 3, further comprising:

a second bit line; and a sense amplifier coupled to the bit line and the second bit line, wherein the third voltage is a ground voltage.

7. The memory device according to claim 1, wherein a sixth voltage higher than the third voltage is applied to the bit line after the first period, and a seventh voltage higher than the sixth voltage is applied to the bit line after the application of the sixth voltage.

8. The memory device according to claim 7, wherein the seventh voltage is applied to the bit line over at least a part of a period during which the fourth voltage is applied to the plate line.

9. The memory device according to claim 7, further comprising a third voltage generator that generates the sixth voltage, wherein the third voltage generator is disabled at least during a period in which the seventh voltage is applied to the bit line.

10. The memory device according to claim 7, wherein the seventh voltage is a power supply voltage.

11. The memory device according to claim 1, further comprising:

a first circuit including the transistor, the capacitor, the plate line, the bit line, and a sense amplifier coupled to the bit line, the first circuit having a first row address;

a second circuit including a second memory cell including a transistor and a capacitor coupled in series, a second plate line coupled to one end of the second memory cell, a second bit line coupled to another end of the second memory cell, and a second sense amplifier coupled to the second bit line, the second circuit having a second row address; and a third circuit including a third memory cell including a transistor and a capacitor coupled in series, a third plate line coupled to one end of the third memory cell, a third bit line coupled to another end of the third memory cell, and a third sense amplifier coupled to the third bit line, the third circuit having a third row address, wherein the first row address and the second row address have the same value in a first portion and different values in a second portion, the third row address has, in the first portion, a value different from the value of the first portion of the first row address and the value of the first portion of the second row address, and the fourth voltage is applied to the third plate line during at least a part of the second period.

12. The memory device according to claim 11, wherein the fourth voltage is applied to the second plate line during at least a part of the second period.

13. The memory device according to claim 1, wherein the fourth voltage has a first magnitude when a temperature of the memory device is a first temperature, and has a second magnitude when the temperature is a second temperature, the second temperature is higher than the first temperature, and the second magnitude is higher than the first magnitude.

14. The memory device according to claim 1, wherein the first voltage has a third magnitude when a temperature of the memory device is a first temperature, and has a fourth magnitude when the temperature is a second temperature, the second temperature is higher than the first temperature, and the fourth magnitude is lower than the third magnitude.

15. The memory device according to claim 14, further comprising:

a fourth voltage generator that generates a first reference voltage;

a first charge pump that outputs the first voltage based on a first control signal; and a first comparison circuit that receives the first voltage and the first reference voltage and outputs the first control signal based on a comparison between the first voltage and the first reference voltage.

16. The memory device according to claim 14, wherein the third voltage has a fifth magnitude when the temperature is the first temperature and has a sixth magnitude when the temperature is the second temperature, and the sixth magnitude is lower than the fifth magnitude.

17. The memory device according to claim 16, further comprising:

a fifth voltage generator that generates a second reference voltage;

a second charge pump that outputs the third voltage based on a second control signal; and a second comparison circuit that receives the third voltage and the second reference voltage and outputs the second control signal based on a comparison between the third voltage and the second reference voltage.

18. The memory device according to claim 16, wherein a change rate from the third magnitude to the fourth magnitude based on a change in the temperature is different from a change rate from the fifth magnitude to the sixth magnitude based on the change in the temperature.

19. The memory device according to claim 1, wherein an eighth voltage is applied to the bit line over the second period.

20. The memory device according to claim 19, further comprising a third bit line, wherein the bit line is coupled to the third bit line over the second period.

21. The memory device according to claim 1, wherein the fourth voltage is a power supply voltage.

* * * * *